US012699216B2

(12) United States Patent
Kim et al.

(10) Patent No.: US 12,699,216 B2
(45) Date of Patent: Aug. 4, 2026

(54) DISPLAY DEVICE INCLUDING RETARDATION CONTROL FILM

(71) Applicant: Samsung Display Co., Ltd., Yongin-Si (KR)

(72) Inventors: Ji-Hoon Kim, Hwaseong-si (KR); Gilyeong Park, Asan-si (KR); Eunmi Seo, Cheonan-si (KR); Minju Oh, Suwon-si (KR); Minkyoung Jung, Jeongseon-gun (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 717 days.

(21) Appl. No.: 17/576,044

(22) Filed: Jan. 14, 2022

(65) Prior Publication Data

US 2022/0310977 A1 Sep. 29, 2022

(30) Foreign Application Priority Data

Mar. 23, 2021 (KR) ........................ 10-2021-0037473

(51) Int. Cl.
| | |
|---|---|
| *H01L 29/18* | (2006.01) |
| *G02B 5/30* | (2006.01) |
| *H01L 33/00* | (2010.01) |
| *H10K 59/80* | (2023.01) |
| *H10K 59/122* | (2023.01) |
| *H10K 102/00* | (2023.01) |

(52) U.S. Cl.
CPC ........... *G02B 5/3033* (2013.01); *H10K 59/87* (2023.02); *H10K 59/8791* (2023.02); *H10K 59/122* (2023.02); *H10K 59/871* (2023.02); *H10K 2102/311* (2023.02); *H10K 2102/351* (2023.02)

(58) Field of Classification Search
CPC ................ H10K 50/86; H10K 59/122; H10K 2102/311; H10K 2102/351; H10K 59/871; H10K 59/87; H10K 59/8791; H10K 59/50; H10K 50/84; H10K 77/111; G02B 5/3083; G02B 5/3033; G02B 1/04; Y02E 10/549; G09F 9/301; G09F 9/33; H01L 27/1214
See application file for complete search history.

(56) References Cited

U.S. PATENT DOCUMENTS

| | | | |
|---|---|---|---|
| 8,344,396 B2 | 1/2013 | Shim et al. | |
| 2002/0054258 A1* | 5/2002 | Kondo | G02F 1/133615 349/113 |
| 2008/0074595 A1* | 3/2008 | Nakatsugawa | G02F 1/13363 349/117 |
| 2016/0035998 A1* | 2/2016 | Hahm | H10K 50/88 438/26 |

(Continued)

FOREIGN PATENT DOCUMENTS

| | | |
|---|---|---|
| CN | 109256479 A | 1/2019 |
| CN | 111477670 A | 7/2020 |

(Continued)

*Primary Examiner* — Ismail A Muse
(74) *Attorney, Agent, or Firm* — CANTOR COLBURN LLP

(57) ABSTRACT

A display device includes a display panel including a light emitting element which generates a light, an anti-reflection film disposed on the display panel, a support plate disposed under the display panel to support the display panel, and a retardation control film disposed between the display panel and the support plate.

19 Claims, 19 Drawing Sheets

(56) References Cited

U.S. PATENT DOCUMENTS

| | | | | |
|---|---|---|---|---|
| 2016/0178821 A1* | 6/2016 | Choi | G02B 1/111 | |
| | | | 349/194 | |
| 2017/0278902 A1* | 9/2017 | Choi | H10K 50/844 | |
| 2019/0019450 A1* | 1/2019 | Ahn | H10K 59/8794 | |
| 2019/0165332 A1* | 5/2019 | Kwon | H10K 50/15 | |
| 2019/0181193 A1* | 6/2019 | Kwon | H10K 50/844 | |
| 2019/0369668 A1* | 12/2019 | Kim | G06F 1/1652 | |
| 2019/0372051 A1* | 12/2019 | Kwon | H10K 59/87 | |
| 2020/0064529 A1* | 2/2020 | Lee | G06F 3/0412 | |
| 2020/0163231 A1 | 5/2020 | Park | | |
| 2020/0192165 A1* | 6/2020 | Hasegawa | G02B 5/3083 | |
| 2020/0292739 A1 | 9/2020 | Tomohisa et al. | | |
| 2022/0106500 A1* | 4/2022 | Okamoto | G02B 5/305 | |

FOREIGN PATENT DOCUMENTS

| | | | |
|---|---|---|---|
| CN | 111696440 A | 9/2020 |
| KR | 1020110131807 A | 12/2011 |
| KR | 101713277 B1 | 3/2017 |
| KR | 101743693 B1 | 6/2017 |
| KR | 1020170083685 A | 7/2017 |
| KR | 1020170113762 A | 10/2017 |
| KR | 1020190074512 A | 6/2019 |
| KR | 1020190137433 A | 12/2019 |
| KR | 1020200057869 A | 5/2020 |

* cited by examiner

WM
RPF
DP
RCF
SP

DR3
DR2 ⊗ → DR1

DP

100PE
AE  EL  CE

140

70-OP
70       130
60
CNT3
50
40       120
30
20
10

110

G1  SC1  AC1  DC1     BFL     CNE2 / SCL   CNT2
                              CNE1    CNT1
100PC

DR3
DR2 ⊗ → DR1

Rth = 0nm

Rth = 100nm

Rth = 500nm

Rth = 2000nm

DISPLAY DEVICE INCLUDING RETARDATION CONTROL FILM

This application claims priority to Korean Patent Application No. 10-2021-0037473, filed on Mar. 23, 2021, and all the benefits accruing therefrom under 35 U.S.C. § 119, the content of which in its entirety is herein incorporated by reference.

BACKGROUND

1. Field

The disclosure relates to a display device. More particularly, the disclosure relates to a display device having an anti-reflection function with respect to an external light.

2. Description of the Related Art

A display device displays a variety of images through a display screen thereof to provide a user with information. In general, the display device displays the information through a display screen defined therewith.

In recent years, flexible display devices including a flexible display panel that is foldable are being developed. Different from a rigid display device, the flexible display device may be folded, rolled, or bent. Since the shape of the flexible display device is changed in various ways, portability of the flexible display device may be improved regardless of its original screen size, and thus, a user convenience is improved.

SUMMARY

The disclosure provides a display device having improved anti-reflection function with respect to an external light.

Embodiments of the invention provide a display device including a display panel including a light emitting element which generates a light, an anti-reflection film disposed on the display panel, a support plate disposed under the display panel to support the display panel, and a retardation control film disposed between the display panel and the support plate.

Embodiments of the invention provide a display device including a folding area folded about an imaginary folding axis. In such embodiments, the display device includes a display panel including a light emitting element which generates a light, an anti-reflection film disposed on the display panel, a support plate disposed under the display panel to support the display panel, and a retardation control film disposed between the display panel and the support plate and having a thickness retardation of about 0 nanometers (nm) to about 100 nm.

According to embodiments of the invention, where the support plate is disposed under the display panel, the retardation control film is provided between the display panel and the support plate, and thus, the external light reflected by the support plate is effectively prevented from being perceived by a user. Accordingly, the display device has improved anti-reflection function with respect to the external light by the retardation control film disposed between the display panel and the support plate.

BRIEF DESCRIPTION OF THE DRAWINGS

The above and other features of the disclosure will become readily apparent by reference to the following detailed description when considered in conjunction with the accompanying drawings, in which.

DETAILED DESCRIPTION

Figure 1:
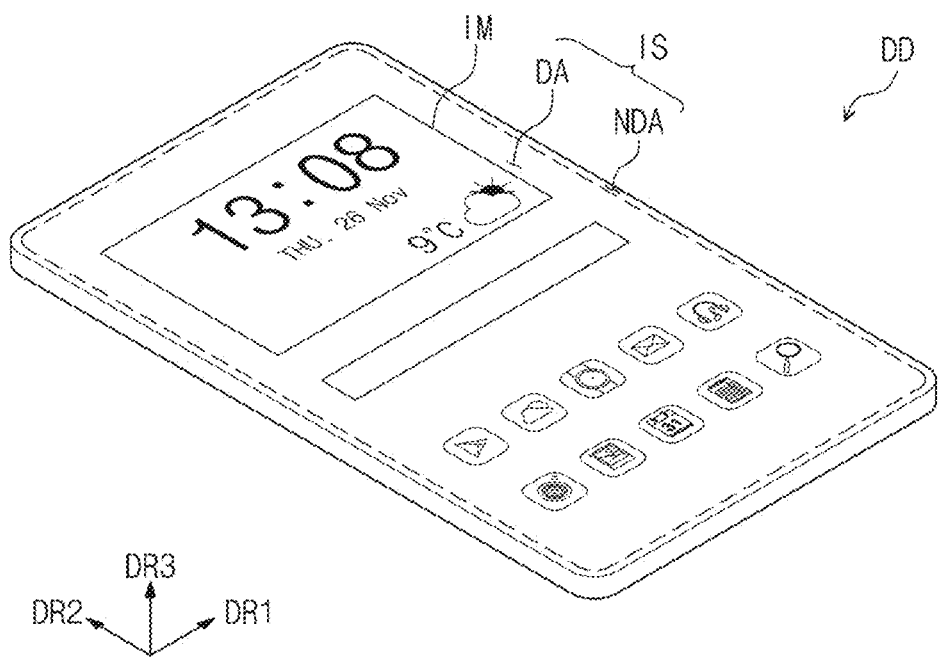
FIG. 1 is a perspective view showing a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the disclosure, it will be understood that when an element or layer is referred to as being "on", "connected to" or "coupled to" another element or layer, it can be directly on, connected or coupled to the other element or layer or intervening elements or layers may be present. In contrast, when an element is referred to as being "directly on" another element, there are no intervening elements present.

Like numerals refer to like elements throughout. In the drawings, the thickness, ratio, and dimension of components are exaggerated for effective description of the technical content. "Or" means "and/or." As used herein, the term "and/or" includes any and all combinations of one or more of the associated listed items.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

Figure 2A:
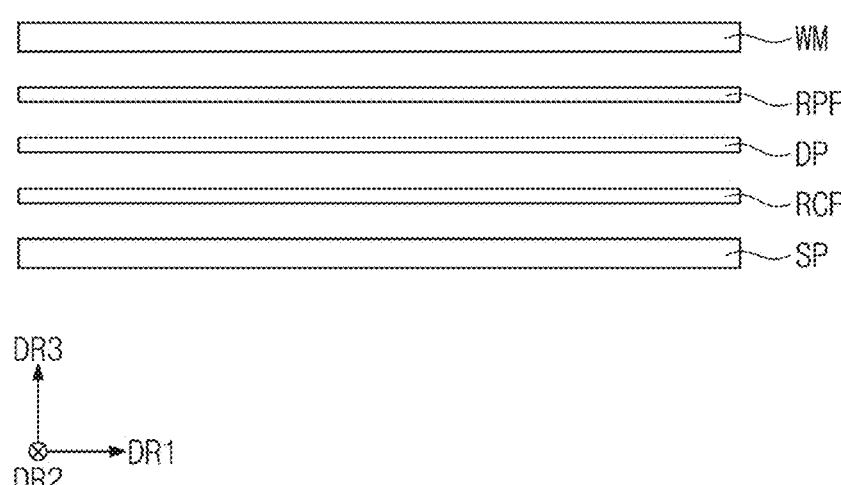
FIG. 2A is an exploded cross-sectional view showing a display device according to an embodiment of the disclosure.
Figure 2B:
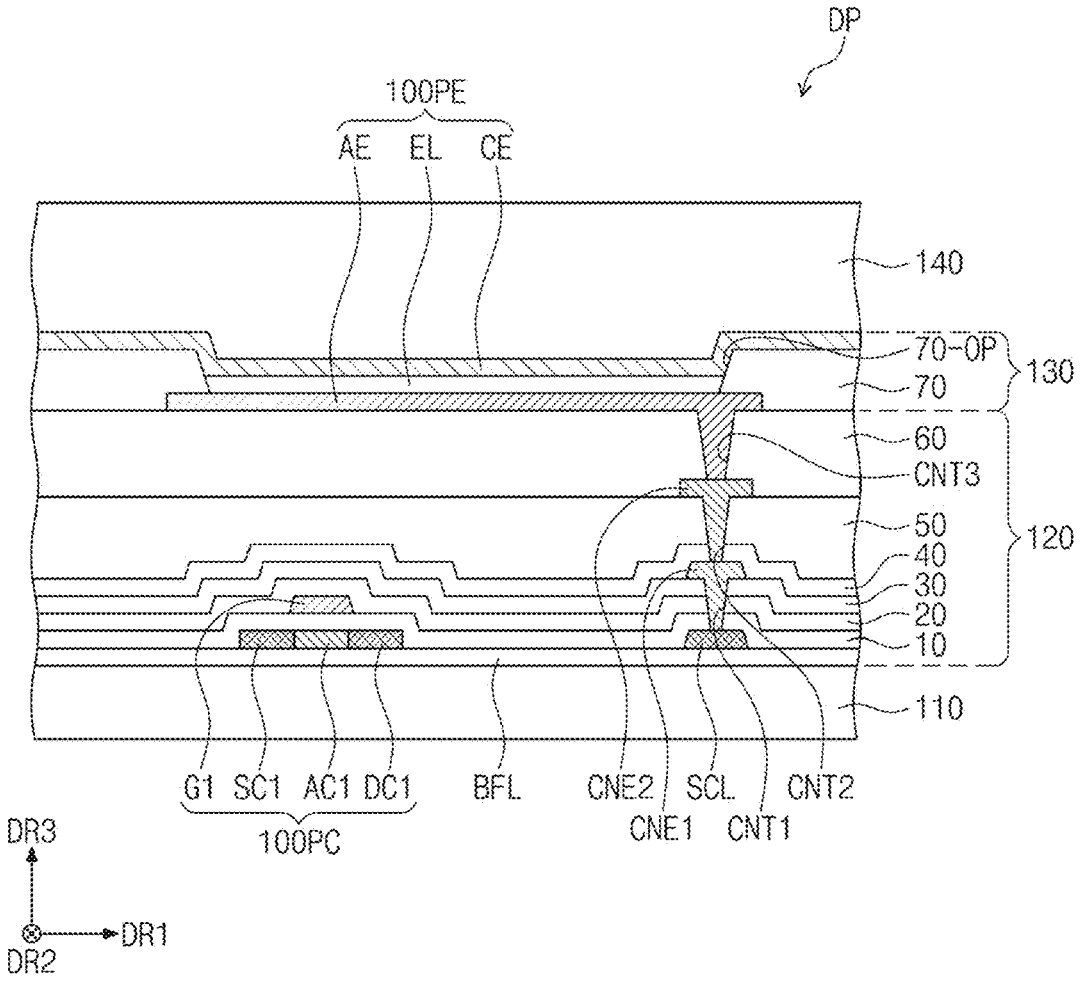
FIG. 2B is a cross-sectional view showing a display panel shown in FIG. 2A.
Figure 3:
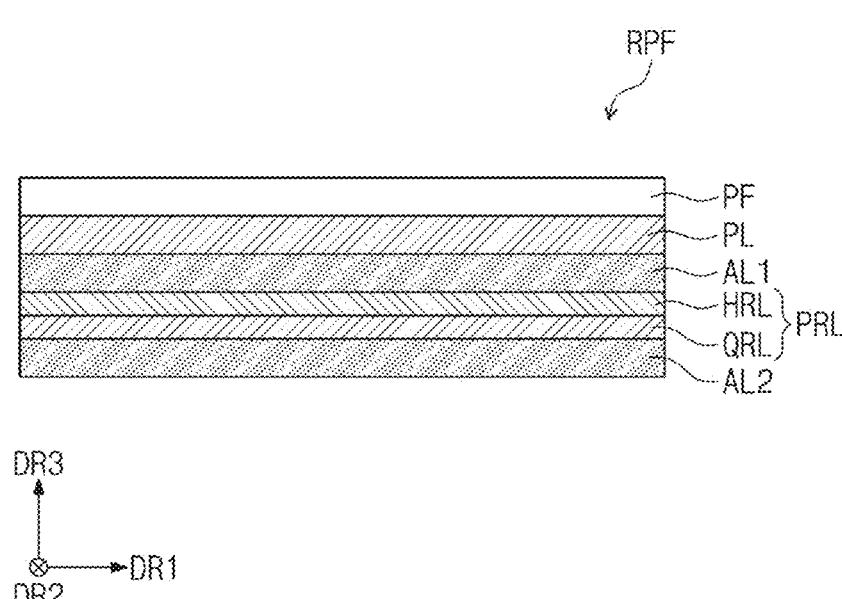
FIG. 3 is a cross-sectional view showing an anti-reflection film shown in FIG. 2A.
Figure 4A:
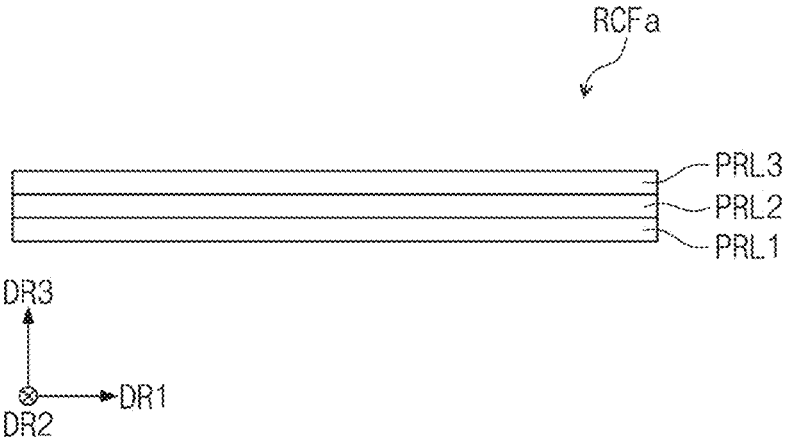
FIGS. 4A and 4B are cross-sectional view showing retardation control films according to embodiments of the disclosure.
Figure 4B:
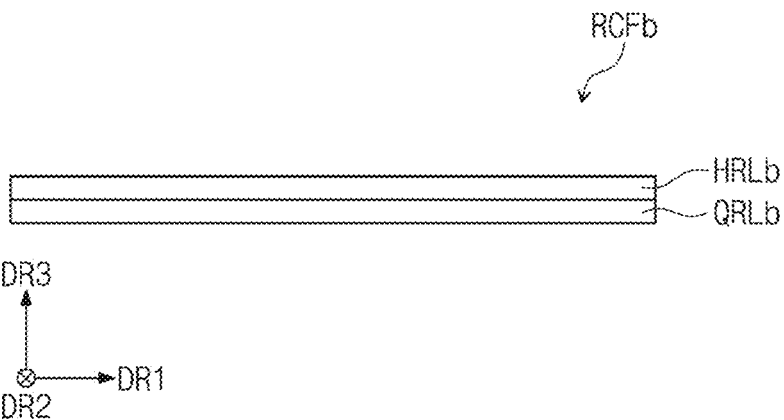

FIG. 1 is a perspective view showing a display device DD according to an embodiment of the disclosure. FIG. 2A is an exploded cross-sectional view showing the display device DD according to an embodiment of the disclosure, and FIG. 2B is a cross-sectional view showing a display panel DP shown in FIG. 2A. FIG. 3 is a cross-sectional view showing an anti-reflection film RPF shown in FIG. 2A. FIGS. 4A and 4B are cross-sectional views showing retardation control films according to embodiments of the disclosure.

Referring to FIG. 1, an embodiment of the display device DD may be a device that is activated in response to an electrical signal. The display device DD may be applied to various devices including a large-sized electronic item, such as a television set, a monitor, an outdoor billboard, etc., and a small and medium-sized electronic item, such as a personal computer, a notebook computer, a personal digital assistant, a car navigation unit, a game unit, a portable electronic device, or a camera, etc. Hereinafter, for convenience of illustration and description, embodiments where the display device DD is a smartphone will be described in detail.

The display device DD may include a display area DA and a non-display area NDA, which are defined therein. The display area DA is an area in which an image IM is displayed, and the non-display area NDA is an area in which the image IM is not displayed. The display area DA is substantially parallel to a surface defined by a first direction DR1 and a second direction DR2. A third direction DR3 indicates a normal line direction of the display area DA, i.e., a thickness direction of the display device DD. The display device DD displays the image IM to the third direction DR3.

In embodiments, front (or upper) and rear (or lower) surfaces of each member of the display device DD may be defined with respect to a direction in which the image IM is displayed. The front and rear surfaces may be opposite to each other in the third direction DR3, and a normal line direction of each of the front and rear surfaces may be substantially parallel to the third direction DR3. A separation distance in the third direction DR3 between the front surface and the rear surface may correspond to a thickness or a height in the third direction DR3 of the display device DD. In such embodiments, directions indicated by the first, second, and third directions DR1, DR2, and DR3 are relative to each other and may be changed to other directions.

The non-display area NDA may be defined adjacent to the display area DA, and a bezel area of the display device DD may be defined by the non-display area NDA. The non-display area NDA may surround the display area DA. However, this is merely one embodiment. According to an alternative embodiment, the non-display area NDA may be defined adjacent to only a portion of an edge of the display area DA or may be omitted, but not being limited thereto or thereby.

Referring to FIGS. 1, 2A, and 2B, an embodiment of the display device DD may include the display panel DP and a window WM. The display panel DP may be a flexible display panel. In such an embodiment, since the display panel DP is flexible, the display panel DP may have a shape that may be changed based on a bending, folding, or rolling operation. In one embodiment, for example, the display panel DP may be a light emitting type display panel including a light emitting element generating a light.

In an embodiment, as shown in FIG. 2B, the display panel DP may include a base layer 110, a circuit layer 120, a light emitting element layer 130, and an encapsulation layer 140.

The base layer 110 may provide a base surface on which the circuit layer 120 is disposed. The base layer 110 may be a glass substrate, a metal substrate, or a polymer substrate, but not being limited thereto or thereby, and alternatively, the base layer 110 may be an inorganic layer, an organic layer, or a composite material layer.

The base layer 110 may have a multi-layer structure. In one embodiment, for example, the base layer 110 may include a first synthetic resin layer, a silicon oxide (SiOx) layer disposed on the first synthetic resin layer, an amorphous silicon ("a-Si") layer disposed on the silicon oxide layer, and a second synthetic resin layer disposed on the a-Si layer. The silicon oxide layer and the a-Si layer may be referred to as a base barrier layer.

Each of the first and second synthetic resin layers may include a polyimide-based resin. In addition, each of the first and second synthetic resin layers may include at least one selected from an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin.

The circuit layer 120 may be disposed on the base layer 110. The circuit layer 120 may include an insulating layer, a semiconductor pattern, a conductive pattern, and a signal line. In an embodiment, an insulating layer, a semiconductor layer, and a conductive layer may be formed on the base layer 110 by a coating or depositing process. Then, the insulating layer, the semiconductor layer, and the conductive layer may be selectively patterned through several photolithography processes. Thus, the semiconductor pattern, the conductive pattern, and the signal line included in the circuit layer 120 may be formed.

The light emitting element layer 130 may be disposed on the circuit layer 120. The light emitting element layer 130 may include the light emitting element. In one embodiment, for example, the light emitting element layer 130 may include an organic light emitting material, a quantum dot, a quantum rod, a micro-light emitting diode ("LED"), or a nano-LED.

The encapsulation layer 140 may be disposed on the light emitting element layer 130. The encapsulation layer 140 may protect the light emitting element layer 130 from moisture, oxygen, and a foreign substance such as dust particles.

At least one inorganic layer may be disposed on an upper surface of the base layer 110. The inorganic layer may include at least one selected from aluminum oxide, titanium oxide, silicon oxide, silicon oxynitride, zirconium oxide, and hafnium oxide. The inorganic layer may have a multi-layer structure or be formed in multiple layers. The inorganic layers formed in multiple layers may define a barrier layer and/or a buffer layer. In an embodiment, the display panel DP may further include a buffer layer BFL.

The buffer layer BFL may increase a cohesive force between the base layer 110 and the semiconductor pattern. The buffer layer BFL may include a silicon oxide layer and a silicon nitride layer, and the silicon oxide layer and the silicon nitride layer may be alternately stacked with each other.

The semiconductor pattern may be disposed on the buffer layer BFL. The semiconductor pattern may include polysilicon, but not being limited thereto or thereby. Alternatively, the semiconductor pattern may include a-Si, low-temperature polycrystalline silicon, or oxide semiconductor.

FIG. 2B shows only a portion of the semiconductor pattern, and the semiconductor pattern may be further disposed in other areas. The semiconductor pattern may be arranged with a specific pattern or arrangement over pixels. The semiconductor pattern may have different electrical properties depending on whether it is doped or not or whether it is doped with an N-type dopant or a P-type dopant. The semiconductor pattern may include a high conductance region with high conductivity and a low conductance region with low conductivity. The high conductance region may be doped with the N-type dopant or the P-type dopant. A P-type transistor may include a doped region doped with the P-type dopant, and an N-type transistor may include a doped region doped with the N-type dopant. The low conductance region may be a non-doped region or may be doped at a concentration lower than the high conductivity region.

The high conductance region may have a conductivity greater than that of the low conductance region and may substantially serve as an electrode or signal line. The low conductance region may substantially correspond to an active (or a channel) of a transistor. In such an embodiment, a portion of the semiconductor pattern may be the active of the transistor, another portion of the semiconductor pattern may be a source or a drain of the transistor, and the other portion of the semiconductor pattern may be a connection electrode or a connection signal line.

Each of the pixels may have an equivalent circuit that includes seven transistors, a single capacitor, and the light emitting element, but the equivalent circuit of the pixels may be changed or modified in various ways. FIG. 2B shows one transistor 100PC and the light emitting element 100PE included in the pixel.

The transistor 100PC may include a source area SC1, an active area AC1, a drain area DC1, and a gate G1. The source area SC1, the active area AC1, and the drain area DC1 may be formed or defined in the semiconductor pattern. The source area SC1 and the drain area DC1 may extend in opposite directions to each other from the active area AC1 in a cross-section. FIG. 2B shows a portion of a connection signal line SCL formed from the semiconductor pattern. Although not shown in figures, the connection signal line SCL may be electrically connected to the drain area DC1 of the transistor 100PC in a plane.

A first insulating layer 10 may be disposed on the buffer layer BFL. The first insulating layer 10 may commonly overlap the pixels and may cover the semiconductor pattern. The first insulating layer 10 may be an inorganic layer and/or an organic layer and may have a single-layer or multi-layer structure. The first insulating layer 10 may include at least one selected from aluminum oxide, titanium oxide, silicon oxide, silicon nitride, silicon oxynitride, zirconium oxide, and hafnium oxide. In an embodiment, the first insulating layer 10 may have a single-layer structure of a silicon oxide layer. Not only the first insulating layer 10, but also an insulating layer of the circuit layer 120 described later may be an inorganic layer and/or an organic layer and may have a single-layer or multi-layer structure. The inorganic layer may include at least one selected from the above-mentioned materials, but not being limited thereto.

The gate G1 of the transistor 100PC may be disposed on the first insulating layer 10. The gate G1 may be defined by a portion of a metal pattern. The gate G1 may overlap the active area AC1. The gate G1 may be used as a mask in a process of doping the semiconductor pattern.

A second insulating layer 20 may be disposed on the first insulating layer 10 and may cover the gate G1. The second insulating layer 20 may commonly overlap the pixels. The second insulating layer 20 may be an inorganic layer and/or an organic layer and may have a single-layer or multi-layer structure. The second insulating layer 20 may include at least one selected from silicon oxide, silicon nitride, and silicon oxynitride. In an embodiment, the second insulating layer 20 may have a multi-layer structure of a silicon oxide layer and a silicon nitride layer.

A third insulating layer 30 may be disposed on the second insulating layer 20. The third insulating layer 30 may have a single-layer structure or a multi-layer structure. In one embodiment, for example, the third insulating layer 30 may have the multi-layer structure including a silicon oxide layer and a silicon nitride layer.

A first connection electrode CNE1 may be disposed on the third insulating layer 30. The first connection electrode CNE1 may be connected to the connection signal line SCL via a contact hole CNT1 defined through the first, second, and third insulating layers 10, 20, and 30.

A fourth insulating layer 40 may be disposed on the third insulating layer 30. The fourth insulating layer 40 may have a single-layer structure of a silicon oxide layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 via a second contact hole CNT2 defined through the fourth insulating layer 40 and the fifth insulating layer 50.

A sixth insulating layer 60 may be disposed on the fifth insulating layer 50 and may cover the second connection electrode CNE2. The sixth insulating layer 60 may be an organic layer.

The light emitting element layer 130 may be disposed on the circuit layer 120. The light emitting element layer 130 may include the light emitting element 100PE and a pixel definition layer 70. In one embodiment, for example, the light emitting element layer 130 may include an organic light emitting material, a quantum dot, a quantum rod, a micro-LED, or a nano-LED. Hereinafter, for convenience of description, embodiments where light emitting element 100PE is the organic light emitting element will be described in detail, but the light emitting element is not particularly limited.

The light emitting element 100PE may include a first electrode AE, a light emitting layer EL, and a second electrode CE. The first electrode AE may be disposed on the sixth insulating layer 60. The first electrode AE may be connected to the second connection electrode CNE2 via a contact hole CNT3 defined through the sixth insulating layer 60.

The pixel definition layer 70 may be disposed on the sixth insulating layer 60 and may cover a portion of the first electrode AE. An opening 70-OP may be defined through the pixel definition layer 70. At least a portion of the first electrode AE may be exposed through the opening 70-OP of the pixel definition layer 70.

The light emitting layer EL may be disposed on the first electrode AE. The light emitting layer EL may be disposed in an area corresponding to the opening 70-OP In an embodiment, the light emitting layer EL may be formed in each of the pixels after being divided into plural portions. In an embodiment where the light emitting layer EL is formed in each of the pixels after being divided into plural portions, each of the light emitting layers EL may emit a light having one of blue, red, and green colors, but not being limited thereto or thereby. According to an alternative embodiment, the light emitting layer EL may be connected to be commonly provided over the pixels without being divided into plural portions. In such an embodiment, the light emitting layer EL may provide a blue light or a white light.

The second electrode CE may be disposed on the light emitting layer EL. The second electrode CE may have an integral shape and may be commonly disposed over the pixels.

The encapsulation layer 140 may be disposed on the light emitting element layer 130. The encapsulation layer 140 may include an inorganic layer, an organic layer, and an inorganic layer, which are sequentially stacked one on another, but layers of the encapsulation layer 140 are not limited thereto or thereby.

The inorganic layers may protect the light emitting element layer 130 from moisture and oxygen, and the organic layer may protect the light emitting element layer 130 from a foreign substance such as dust particles. Each of the inorganic layers may include a silicon nitride layer, a silicon oxynitride layer, a silicon oxide layer, a titanium oxide layer, or an aluminum oxide layer. The organic layer may include an acrylic-based organic layer, but not being limited thereto or thereby.

The display device DD may include at least one functional layer disposed on the display panel DP and at least one protective layer to protect the display panel DP. The functional layer may be an input sensing layer that senses a user input, e.g., a touch operation. The protective layer may absorb impacts applied to the display panel DP from the outside to protect the display panel DP from the impacts. The protective layer may be disposed on each of upper and lower portions of the display panel DP or may be disposed on one of the upper and lower portions of the display panel DP.

The window WM may be disposed on the display panel DP and may define a display surface IS of the display device DD in which the image IM is displayed. The window WM may be optically transparent, such that the user may easily perceive the image IM generated by the display panel DP through the window WM.

The window WM may have a flat shape in the display area DA, however, the shape of the window WM may be changed. In one embodiment, for example, edges of the window WM may have a curved shape.

The window WM may include a window base layer and a window functional layer disposed on the window base layer. The window base layer may include a plastic material or a thin film glass material. In an embodiment, the window base layer may have a single-layer or multi-layer structure. In an embodiment, the window WM has flexibility, such that the shape of the window WM may be changed when the shape of the display panel DP is changed.

The window functional layer may include an impact absorbing layer disposed on and under the window base layer and a hard coating layer having a higher indentation hardness than that of the window base layer to protect the window base layer. In an embodiment, the window functional layer may further include an anti-fingerprint layer.

The window WM may transmit the image from the display panel DP and may substantially simultaneously alleviate the external impacts, and thus, the display panel DP may be effectively prevented from being damaged or malfunctioning due to the external impacts. The external impacts indicate external forces represented by pressure or stress, which cause defects in the display panel DP.

The window WM may alleviate a bending deformation, a compressive deformation, and/or a tensile deformation of the display panel DP caused by impacts and may prevent defects from occurring in the display panel DP due to the impacts.

In one embodiment, for example, the display device DD may further include the anti-reflection film RPF disposed between the display panel DP and the window WM. The anti-reflection film RPF may be disposed on the display panel DP to reduce a reflectance of the external light, e.g., a natural light, incident thereto through the window WM.

Referring to FIG. 3, an embodiment of the anti-reflection film RPF may include a polarization layer PL and a phase retardation layer PRL.

An embodiment of the polarization layer PL may have a transmission axis and an absorption axis substantially perpendicular to the transmission axis. Accordingly, the polarization layer PL may absorb or reflect a component of a light, which is substantially parallel to the absorption axis among components of the light incident thereto, and may transmit only a component of the light, substantially parallel to the transmission axis among components of the light incident thereto. The polarization layer PL may include a polymer resin stretched in a specific direction. In an embodiment, the polymer resin may be a polyvinyl alcohol resin. The polyvinyl alcohol resin may be obtained by saponifying a polyvinyl acetate resin. The polyvinyl acetate resin may include a homopolymer of vinyl acetate or a copolymer obtained by copolymerizing vinyl acetate and a monomer that is copolymerizable with the vinyl acetate. As the monomer that is copolymerizable with the vinyl acetate, unsaturated carboxylic acids, olefins, vinyl ethers, and unsaturated sulfonic acids may be used. According to an embodiment, the polarization layer PL may be a liquid crystal coating type. In such an embodiment, the polarization layer PL may include liquid crystals aligned in a predetermined arrangement.

The phase retardation layer PRL may be a film type or a liquid crystal coating type. In one embodiment, for example, the phase retardation layer PRL may include a first phase retardation layer HRL and a second phase retardation layer QRL. The first phase retardation layer HRL may be disposed between the polarization layer PL and the second phase retardation layer QRL. In one embodiment, for example, the first phase retardation layer HRL may be a $\lambda/2$ phase retardation layer, and the second phase retardation layer QRL may be a $\lambda/4$ phase retardation layer. According to an embodiment, the phase retardation layer PRL may include only one of the first phase retardation layer HRL and the second phase retardation layer QRL.

The anti-reflection film RPF may further include a protective layer PF. The protective layer PF may be disposed on the polarization layer PL to protect an upper surface of the polarization layer PL. The protective layer PF may include a cellulose-based polymer such as triacetate cellulose ("TAC"). In an embodiment, the protective layer PF may further include a hard coating material.

The anti-reflection film RPF may further include first and second inner adhesive layers AL1 and AL2. The first inner adhesive layer AL1 may be disposed between the phase retardation layer PRL and the polarization layer PL, and the second inner adhesive layer AL2 may be disposed on a rear surface of the phase retardation layer PRL. The first inner adhesive layer AL1 may attach the phase retardation layer PRL to the polarization layer PL, and the second inner adhesive layer AL2 may attach the anti-reflection film RPF to the display panel DP. In one embodiment, for example, each of the first and second inner adhesive layers AL1 and AL2 may include a pressure sensitive adhesive ("PSA").

The configuration of the anti-reflection film RPF is not limited thereto or thereby. In one alternative embodiment, for example, the anti-reflection film RPF may further include a layer having a viewing angle compensation function and a layer having a protective function in addition to the above-mentioned layers, or at least one selected from the above-mentioned layers may be omitted.

The display device DD may further include a support plate SP disposed under the display panel DP and a retardation control film RCF disposed between the support plate SP and the display panel DP.

The support plate SP may be disposed on a rear surface of the display panel DP and may support the display panel DP. The support plate SP may be a protective plate for absorbing impacts from the outside or blocking a foreign substance and/or moisture that tends to infiltrate to the display panel DP to protect the display panel DP. In an embodiment, the support plate SP may be coupled with the window WM to have a case shape that defines an appearance of the display device DD. The support plate SP may include a metal material. In one embodiment, for example, the support plate SP may include stainless steel, aluminum, or an alloy thereof.

The retardation control film RCF may have a thickness retardation Rth of about 0 nanometers (nm) to about 100 nm. The thickness retardation Rth is defined by the following Equation.

$$Rth = \left( nz - \frac{nx + ny}{2} \right) d$$

In Equation, d denotes a thickness of the retardation control film RCF in the third direction DR3, nz denotes a refractive index of the retardation control film RCF in the thickness direction, and nx and ny denote a refractive index of the retardation control film RCF with respect to two perpendicular directions that define a plane vertical to the thickness direction.

In a case where the retardation control film RCF includes a plurality of retardation control layers, the thickness retardation Rth of the retardation control film RCF may correspond to a value obtained by summing thickness retardations of the retardation control layers.

The retardation control film RCF may include a transparent material having an optical anisotropy. In one embodiment, for example, the retardation control film RCF may include one selected from a polyester-based resin, a polyolefin-based resin, an acrylic-based resin, a polyurethane-based resin, a polyethersulfone-based resin, a polycarbonate-based resin, a polysulfone-based resin, and a polyether-based resin. In one embodiment, for example, the retardation control film RCF may include polyethylene terephthalate ("PET"), polyethylene naphthalate ("PEN"), polymethyl methacrylate ("PMMA"), and polycarbonate ("PC"). The retardation control film RCF may include a cellulose-based polymer such as TAC. The retardation control film RCF may have a light transmittance equal to or greater than about 85%.

In an embodiment, as shown in FIG. 4A, a retardation control film RCFa may include a plurality of retardation control layers PRL1, PRL2, and PRL3 sequentially stacked in the third direction DR3. The retardation control layers PRL1, PRL2, and PRL3 may have a same thickness retardation as or different thickness retardations from each other. A value obtained by summing thickness retardations of the retardation control layers PRL1, PRL2, and PRL3 may correspond to a thickness retardation Rth of the retardation control film RCFa. In such an embodiment, the thickness retardation Rth of the retardation control film RCFa may be in a range of about 0 nm to about 100 nm.

At least one selected from the retardation control layers PRL1, PRL2, and PRL3 may be manufactured by obliquely stretching a non-stretched film in a direction inclined with respect to a lengthwise direction or a widthwise direction. The lengthwise direction may be one of the first and second directions DR1 and DR2, and the widthwise direction may be the other of the first and second directions DR1 and DR2. That is, at least one of the retardation control layers PRL1, PRL2, and PRL3 may have a stretched direction inclined with respect to the first and second directions DR1 and DR2.

In an embodiment, the retardation control film RCFa may have a reverse wavelength dispersibility. The retardation control layers PRL1, PRL2, and PRL3 may have a same wavelength dispersibility as or different wavelength dispersibilities from each other. The wavelength dispersibility, the thickness, and the stretched direction of each of the retardation control layers PRL1, PRL2, and PRL3 may be determined to allow the retardation control film RCFa to have the reverse wavelength dispersibility. The reverse wavelength dispersibility is a property in which Δn increases as a wavelength increases, where Δn may be defined as a difference between an abnormal refractive index (ne) and a normal refractive index (no) of the retardation control film RCFa.

In an embodiment, as shown in FIG. 4B, a retardation control film RCFb may include two retardation control layers HRLb and QRLb sequentially stacked in the third direction DR3. The two retardation control layers HRLb and QRLb will be referred to as third and fourth phase retardation layers, respectively. In one embodiment, for example, the third phase retardation layer HRLb may be a λ/2 phase retardation layer, and the fourth phase retardation layer QRLb may be a λ/4 phase retardation layer.

The retardation control film RCFb may have a thickness retardation Rth in a range of about 0 nm to about 100 nm. In such an embodiment, the retardation control film RCFb may have a reverse wavelength dispersibility.

Figure 5A:
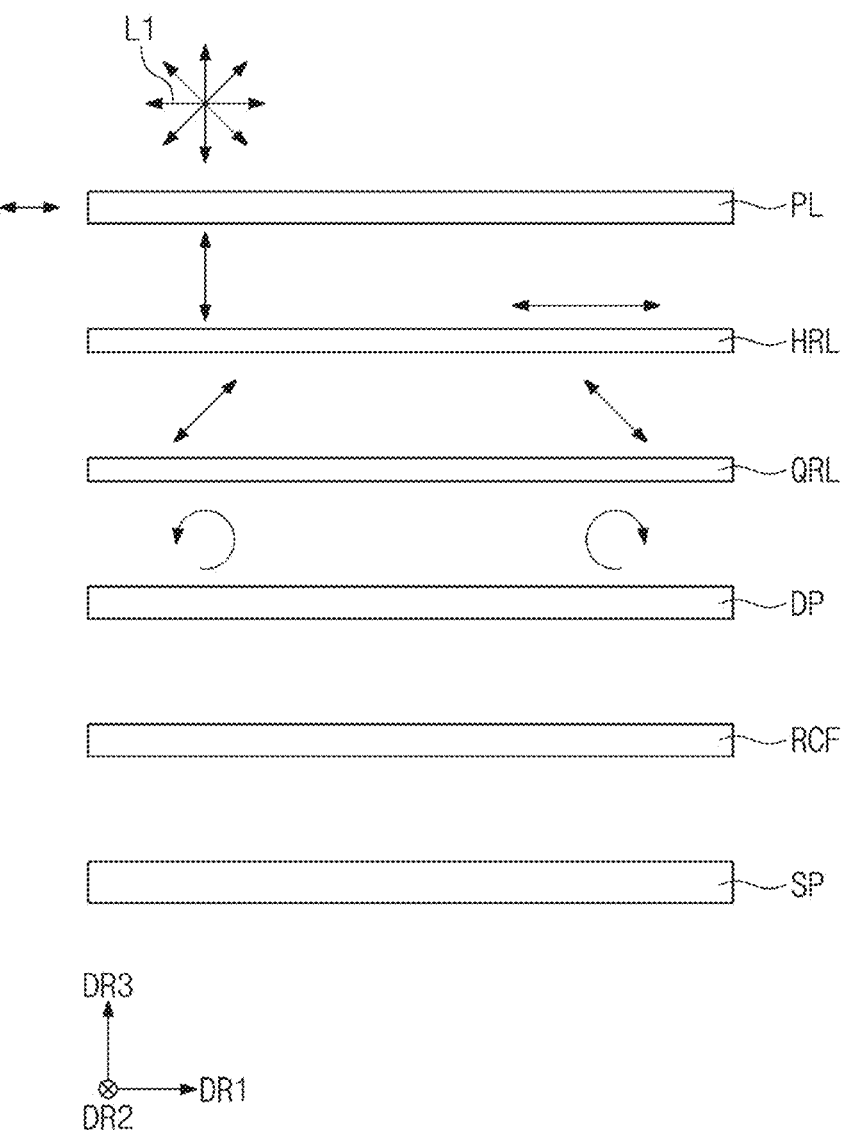
FIG. 5A is a view explaining a function of the anti-reflection film shown in FIG. 2A.
Figure 5B:
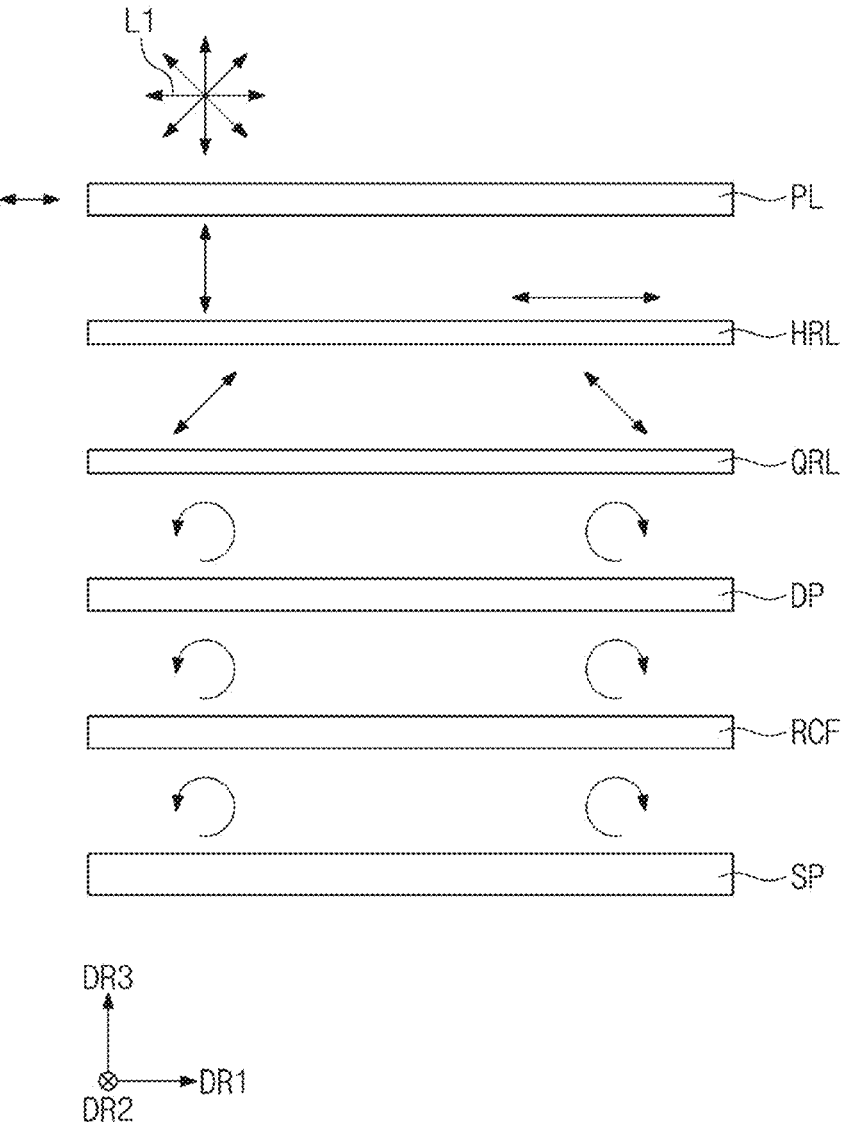
FIG. 5B is a view explaining a function of the retardation control film shown in FIG. 2A.

FIG. 5A is a view explaining a function of the anti-reflection film shown in FIG. 2A, and FIG. 5B is a view explaining a function of the retardation control film shown in FIG. 2A. FIGS. 6A to 6D are images obtained by simulating an external light reflectance as a function of a thickness retardation of the retardation control film shown n FIG. 2A.

Referring to FIGS. 2A and 5A, the polarization layer PL may perform a polarizing function to transmit a light with a specific vibration direction. The polarization layer PL may have the transmission axis and the absorption axis, may transmit the component of the light, which is parallel to the transmission axis, and may absorb the component of the light, which is parallel to the absorption axis.

When an external light L1 is incident to the display device DD, the external light L1 is linearly polarized by the polarization layer PL. In a case where the polarization layer PL has the absorption axis parallel to the first direction DR1, the external light L1 is linearly polarized and output as a light having a component (hereinafter, referred to as a first linearly polarized component) perpendicular to the first direction DR1.

The first phase retardation layer HRL may be a λ/2 phase retardation layer. The first phase retardation layer HRL may have a slow axis inclined with respect to the absorption axis of the polarization layer PL at a predetermined angle. Accordingly, the first phase retardation layer HRL may output the first linearly polarized component with a phase delay. The phase-delayed light may be circularly polarized while passing through the second phase retardation layer QRL. In one embodiment, for example, the second phase retardation layer QRL may be a λ/4 phase retardation layer and may polarize the first linearly polarized component to be left-circularly polarized. Accordingly, the first linearly polarized component may be changed to a circularly polarized component (hereinafter, referred to as a first circularly polarized component) by the first and second phase retardation layers HRL and QRL.

The first circularly polarized component may be reflected by the display panel DP, and a rotational direction thereof may be reversed. In a case where the first circularly polarized component is a left-circularly polarized component, the first circularly polarized component may be reversed to a right-circularly polarized component, and in a case where the first circularly polarized component is the right-circularly polarized component, the first circularly polarized component may be reversed to the left-circularly polarized component. The circularly polarized component reflected by the display panel DP, i.e., a second circularly polarized component, may be linearly polarized while sequentially passing through the second phase retardation layer QRL and the first phase retardation layer HRL. The light linearly polarized by the first and second phase retardation layers HRL and QRL is referred to as a second linearly polarized component. The second linearly polarized component may be substantially parallel to the absorption axis of the polarization layer PL. Accordingly, the second linearly polarized component may not pass through the polarization layer PL and may be absorbed by the polarization layer PL. Therefore, the external light L1 reflected by the display panel DP may not pass through the polarization layer PL and may not be perceived by the user.

Referring to FIG. 5B, a portion of the external light L1 may pass through the display panel DP and may be incident to the retardation control film RCF without being reflected by the display panel DP. That is, the first circularly polarized component that is circularly polarized by the second phase retardation layer QRL may be provided to the retardation control film RCF after passing through the display panel DP. The first circularly polarized component may maintain the polarized state thereof after passing through the retardation control film RCF.

Then, the first circularly polarized component may be reflected by the support plate SP, and a rotational axis thereof may be reversed. In the case where the first circularly polarized component is the left-circularly polarized component, the first circularly polarized component may be reversed to the right-circularly polarized component, and in the case where the first circularly polarized component is the right-circularly polarized component, the first circularly polarized component may be reversed to the left-circularly polarized component.

The circularly polarized component reflected by the support plate SP, i.e., a third circularly polarized component, may be linearly polarized while sequentially passing through the retardation control film RCF, the second phase retardation layer QRL, and the first phase retardation layer HRL. The light linearly polarized by the retardation control film RCF and the first and second phase retardation layers HRL and QRL is referred to as a third linearly polarized component. The third linearly polarized component may be substantially parallel to the absorption axis of the polarization layer PL. Accordingly, the third linearly polarized component may not pass through the polarization layer PL and may be absorbed by the polarization layer PL. Accordingly, the external light L1 reflected by the support plate SP may not pass through the polarization layer PL and may not be perceived by the user.

FIGS. 6A to 6D show a reflection color according to viewing angles. A center of circle represents a front side, a right end point of a diameter passing horizontally through the center of circle represents an azimuth of 0°, and points moved by 90°, 180° and 270° in a counterclockwise direction from the right end point respectively represent azimuths of 90°, 180° and 270°. In a case where the color is uniform in all azimuth, it has high anti-reflection performance with respect to the external light.

Figure 6A:
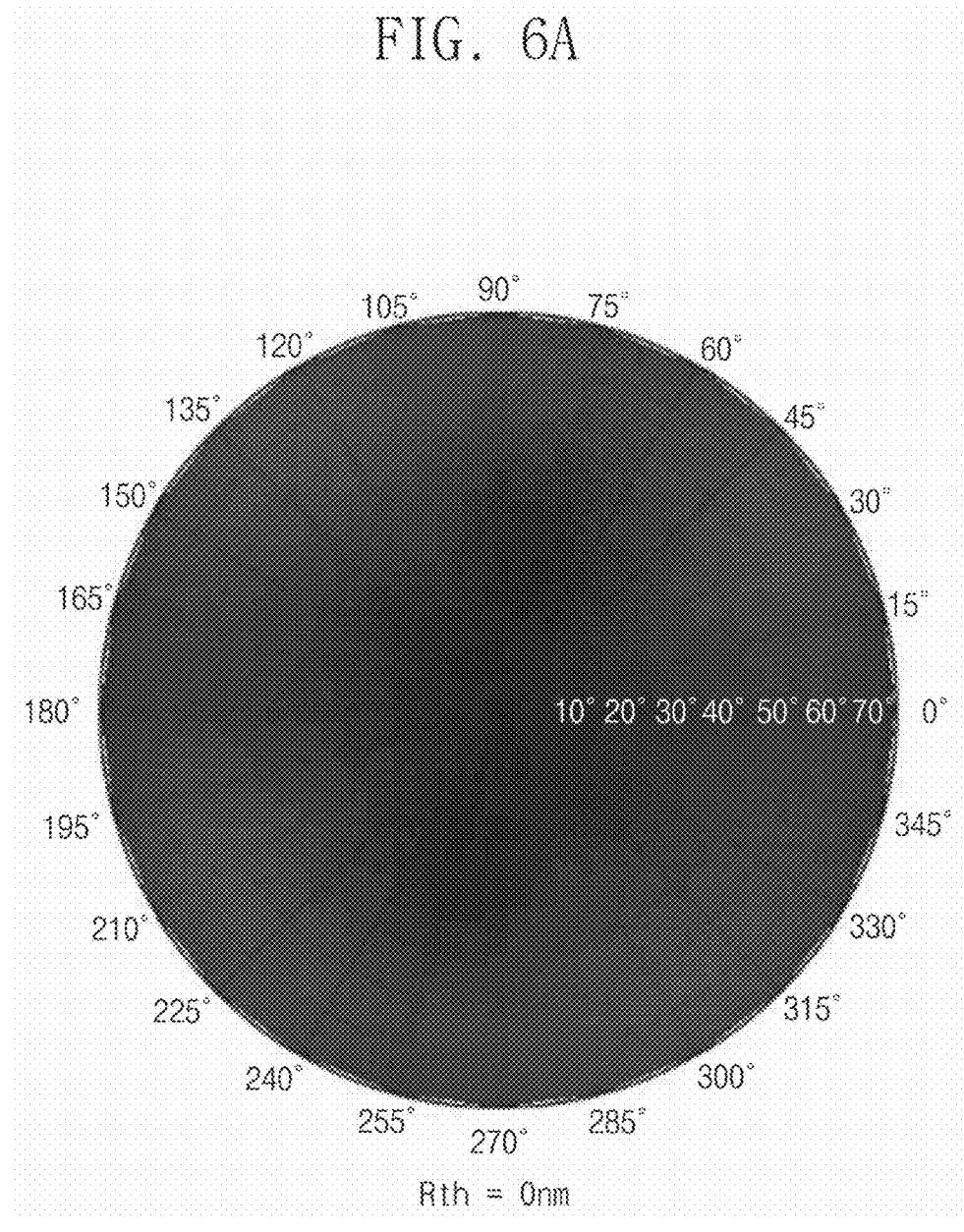
FIGS. 6A to 6D are images obtained by simulating an external light reflectance as a function of a thickness retardation of the retardation control film shown in FIG. 2A.
Figure 6B:
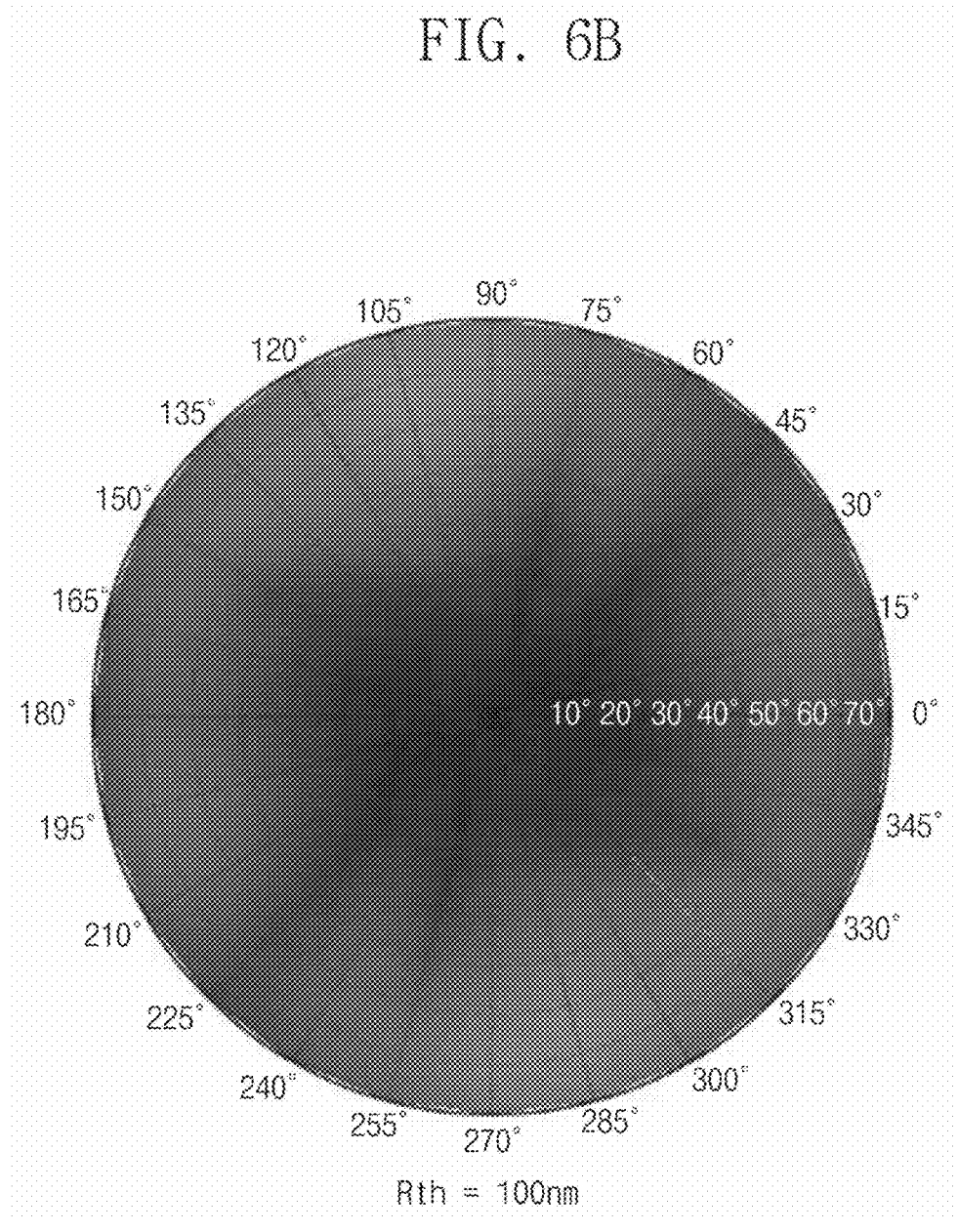
Figure 6C:
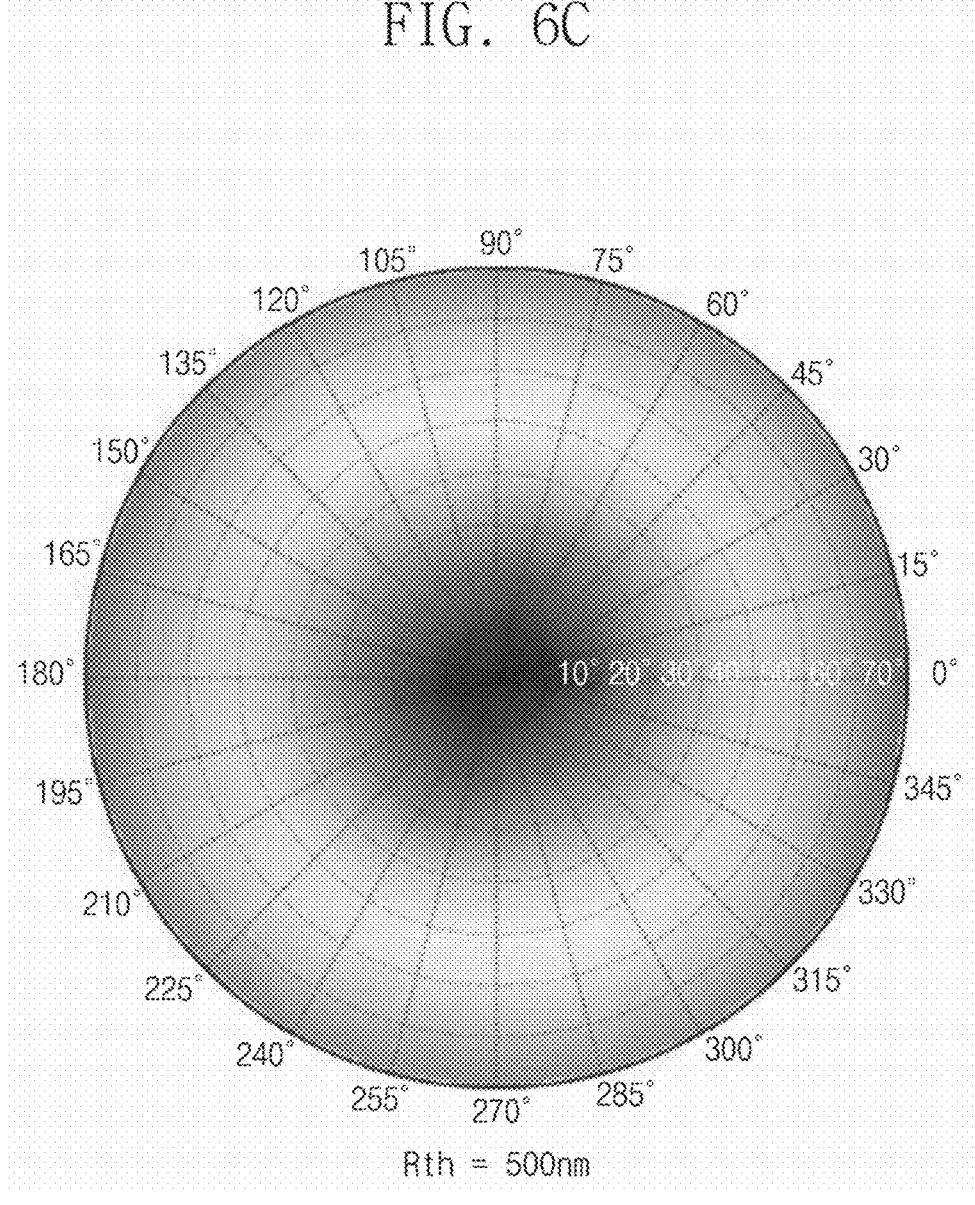
Figure 6D:
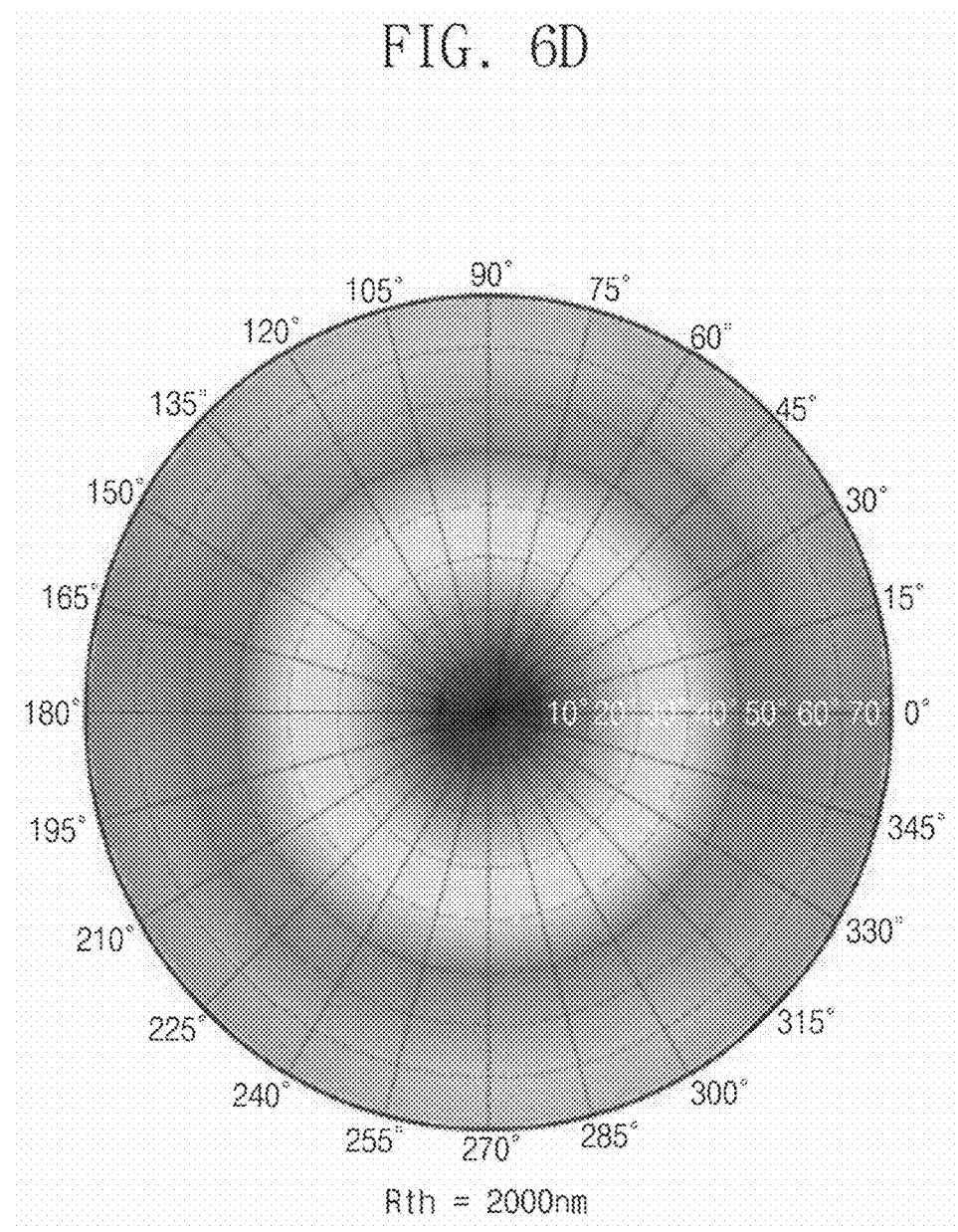

FIG. 6A shows a reflection color when the retardation control film RCF has the thickness retardation of about 0 nm, FIG. 6B shows a reflection color when the retardation control film RCF has the thickness retardation of about 100 nm. In addition, FIG. 6C shows a reflection color when the retardation control film RCF has the thickness retardation of about 500 nm, and FIG. 6D shows a reflection color when the retardation control film RCF has the thickness retardation of about 2000 nm.

According to FIGS. 6A to 6D, when the retardation control film RCF has the thickness retardation Rth in a range of about 0 nm and about 100 nm, the reflection color was found to be relatively uniform. That is, when the retardation control film RCF has the thickness retardation Rth in a range of about 0 nm to about 100 nm, it was observed that the external light is hardly perceived. However, when the thickness retardation Rth of the retardation control film RCF is about 500 nm, the light was perceived at a specific wavelength, and particularly, when the thickness retardation Rth of the retardation control film RCF increases to about 2000 nm, the light in a wider wavelength range was perceived. That is, when the retardation control film RCF has the thickness retardation Rth equal to or greater than about 500 nm, it was observed that the display device has almost no anti-reflection function with respect to the external light.

Accordingly, in embodiments of the invention, the retardation control film RCF may have the thickness retardation in a range of about 0 nm and about 100 nm to allow the display device DD to have improved anti-reflection function with respect to the external light.

Figure 7:
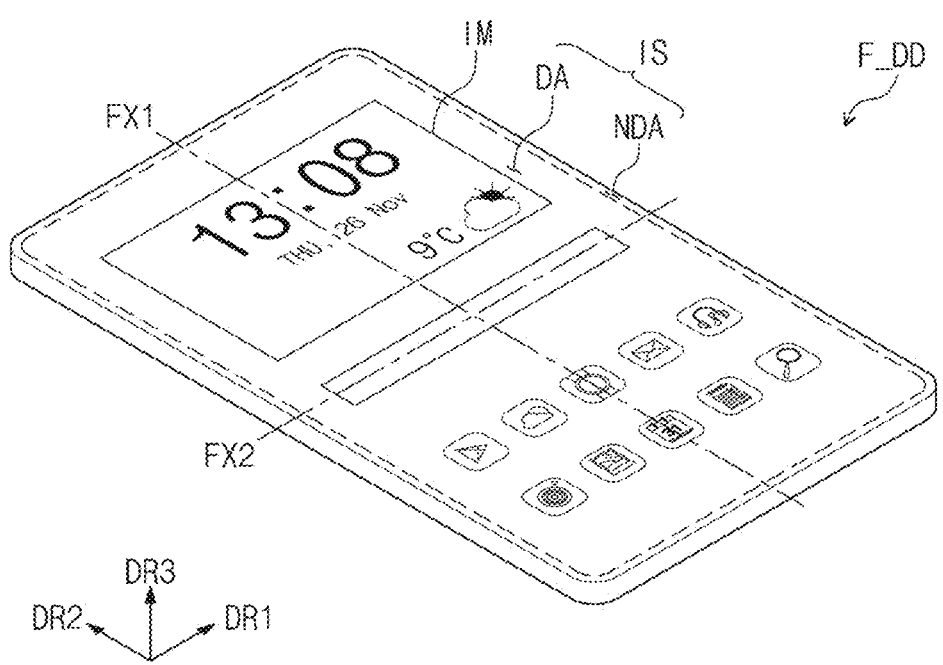
FIG. 7 is a perspective view showing a display device according to an embodiment of the disclosure.
Figure 8A:
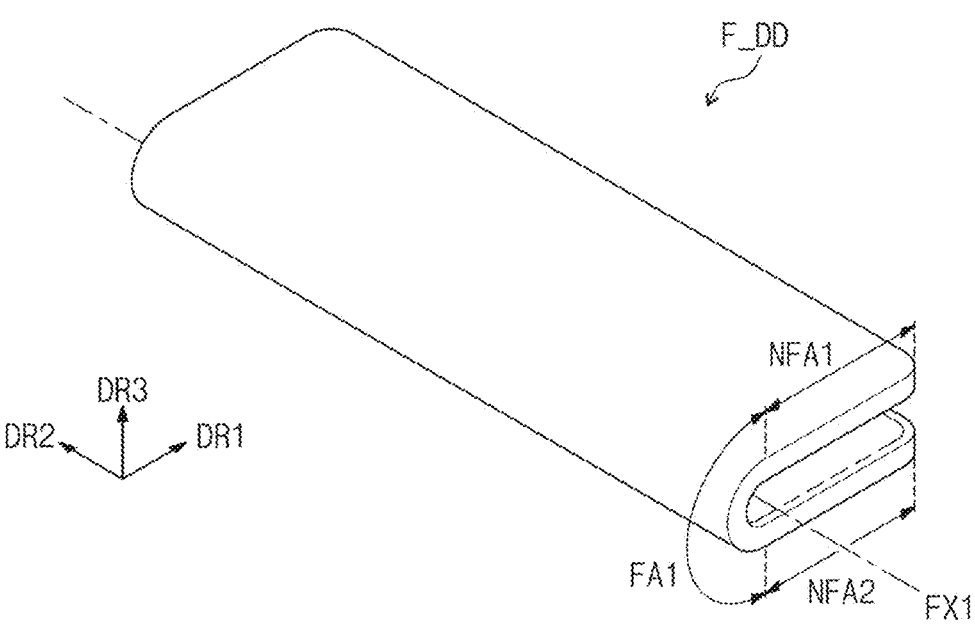
FIG. 8A is a perspective view showing the display device of FIG. 7 in a state in which the display device is inwardly folded (in-folding) about a first folding axis.
Figure 8B:
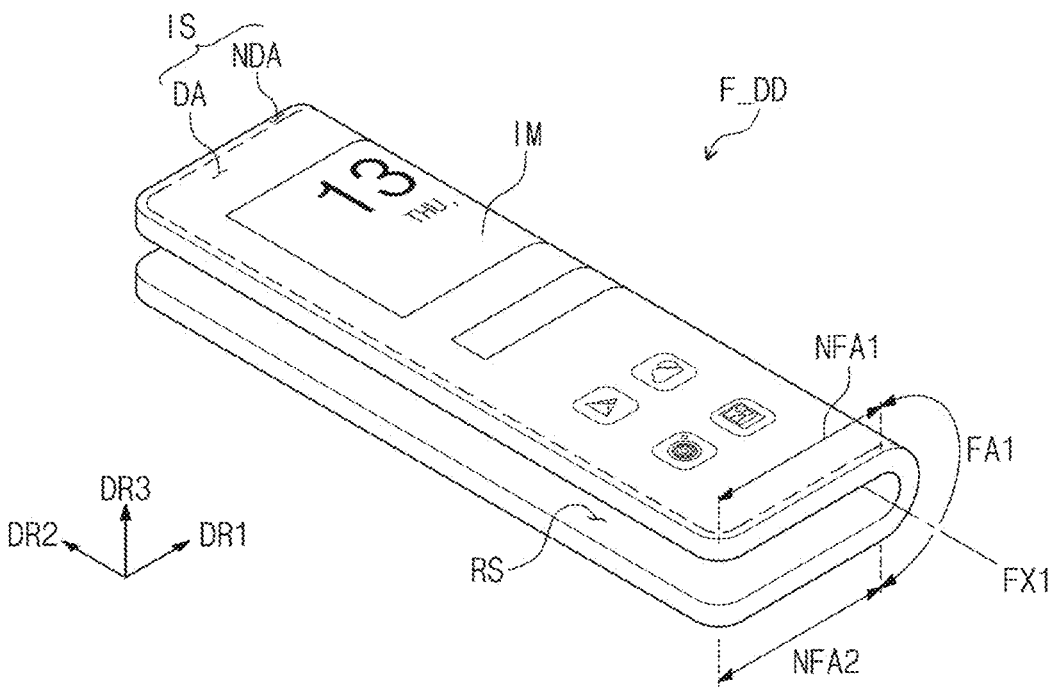
FIG. 8B is a perspective view showing the display device of FIG. 7 in a state in which the display device is outwardly folded (out-folding) about the first folding axis.
Figure 9A:
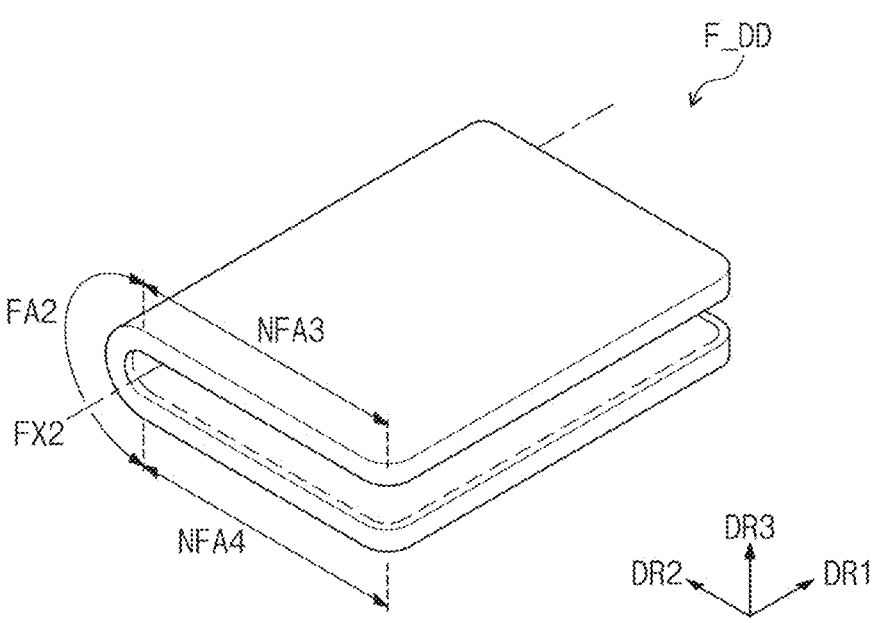
FIG. 9A is a perspective view showing the display device of FIG. 7 in a state in which the display device is inwardly folded (in-folding) about a second folding axis.
Figure 9B:
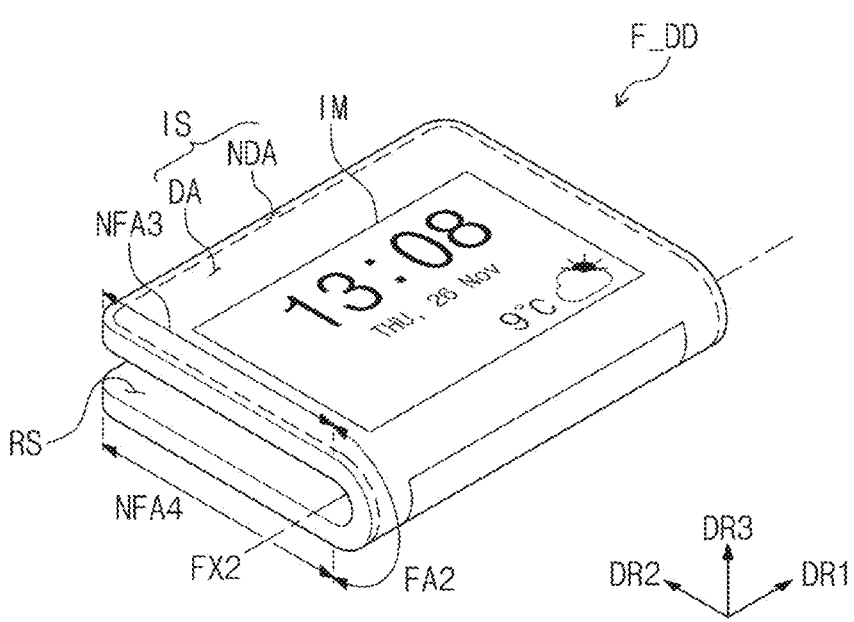
FIG. 9B is a perspective view showing the display device of FIG. 7 in a state in which the display device is outwardly folded (out-folding) about the second folding axis.

FIG. 7 is a perspective view showing a display device F_DD according to an embodiment of the disclosure. FIG. 8A is a perspective view showing the display device F_DD of FIG. 7 in a state in which the display device F_DD is inwardly folded (in-folding) about a first folding axis FX1, and FIG. 8B is a perspective view showing the display device F_DD of FIG. 7 in a state in which the display device F_DD is outwardly folded (out-folding) about the first folding axis FX1. FIG. 9A is a perspective view showing the display device F_DD of FIG. 7 in a state in which the display device F_DD is inwardly folded (in-folding) about a second folding axis FX2, and FIG. 9B is a perspective view showing the display device F_DD of FIG. 7 in a state in which the display device F_DD is outwardly folded (out-folding) about the second folding axis FX2.

Referring to FIG. 7, an embodiment of the display device F_DD may be a foldable display device. The display device F_DD may be folded about folding axes, e.g., the first folding axis FX1 and the second folding axis FX2, extending in the predetermined direction. The first folding axis FX1 may extend in the second direction DR2, and the second folding axis FX2 may extend in the first direction DR1. The display device F_DD may be folded about the first folding axis FX1 or the second folding axis FX2. Hereinafter, a state in which the display device F_DD is folded about the first folding axis FX1 or the second folding axis FX2 is referred to as a folding state, and a state in which the display device F_DD is not folded is referred to as a non-folding state.

In one embodiment, for example, the display device F_DD may include a folding area and two non-folding areas. The folding area may be defined between the two non-folding areas. The folding area may be an area that is folded or deformed about the first or second folding axis FX1 or FX2 to form a curvature. The two non-folding areas may be referred to as first and second non-folding areas, respectively. In one embodiment, for example, the first non-folding area may be disposed at one side of the folding area, and the second non-folding area may be disposed at the other side of the folding area.

The display device F_DD may be inwardly folded (in-folding) or outwardly folded (out-folding) about the first folding axis FX1. Referring to FIG. 8A, the display device F_DD may be folded about the first folding axis FX1 to be in an in-folding state. In the in-folding state, an area of a display surface IS, which overlaps the first non-folding area NFA1, and the other area of the display surface IS, which overlaps the second non-folding area NFA2, may face each other. An area that is bent along the first folding axis FX1 may be defined as a first folding area FA1.

Referring to FIG. 8B, the display device F_DD may be folded about the first folding axis FX1 to be in an out-folding state. In the out-folding state, an area of a rear surface RS of the display device F_DD, which overlaps the first non-folding area NFA1, and the other area of the rear surface RS of the display device F_DD, which overlaps the second non-folding area NFA2, may face each other. In the out-folding state, the display surface IS may be exposed to the outside.

The display device F_DD may be inwardly folded (in-folding) or outwardly folded (out-folding) about the second folding axis FX2. Referring to FIG. 9A, the display device F_DD may be folded about the second folding axis FX2 to be in an in-folding state. In the in-folding state, an area of the display surface IS, which overlaps a third non-folding area NFA3, and the other area of the display surface IS, which overlaps a fourth non-folding area NFA4, may face each other. Accordingly, the display surface IS may not be exposed to the outside in the in-folding state. An area that is bent along the second folding axis FX2 may be defined as a second folding area FA2.

Referring to FIG. 9B, the display device F_DD may be folded about second folding axis FX2 to be in an out-folding state. In the out-folding state, an area of the rear surface RS of the display device F_DD, which overlaps the third non-folding area NFA3, and the other area of the rear surface RS of the display device F_DD, which overlaps the fourth non-folding area NFA4, may face each other. Accordingly, in the out-folding state, the display surface IS may not be exposed to the outside.

However, a folded shape of the display device F_DD is not limited thereto or thereby, the display device F_DD may be folded about a plurality of folding axes, and the number of the folding axes and the number of the non-folding areas are not particularly limited.

Figure 10:
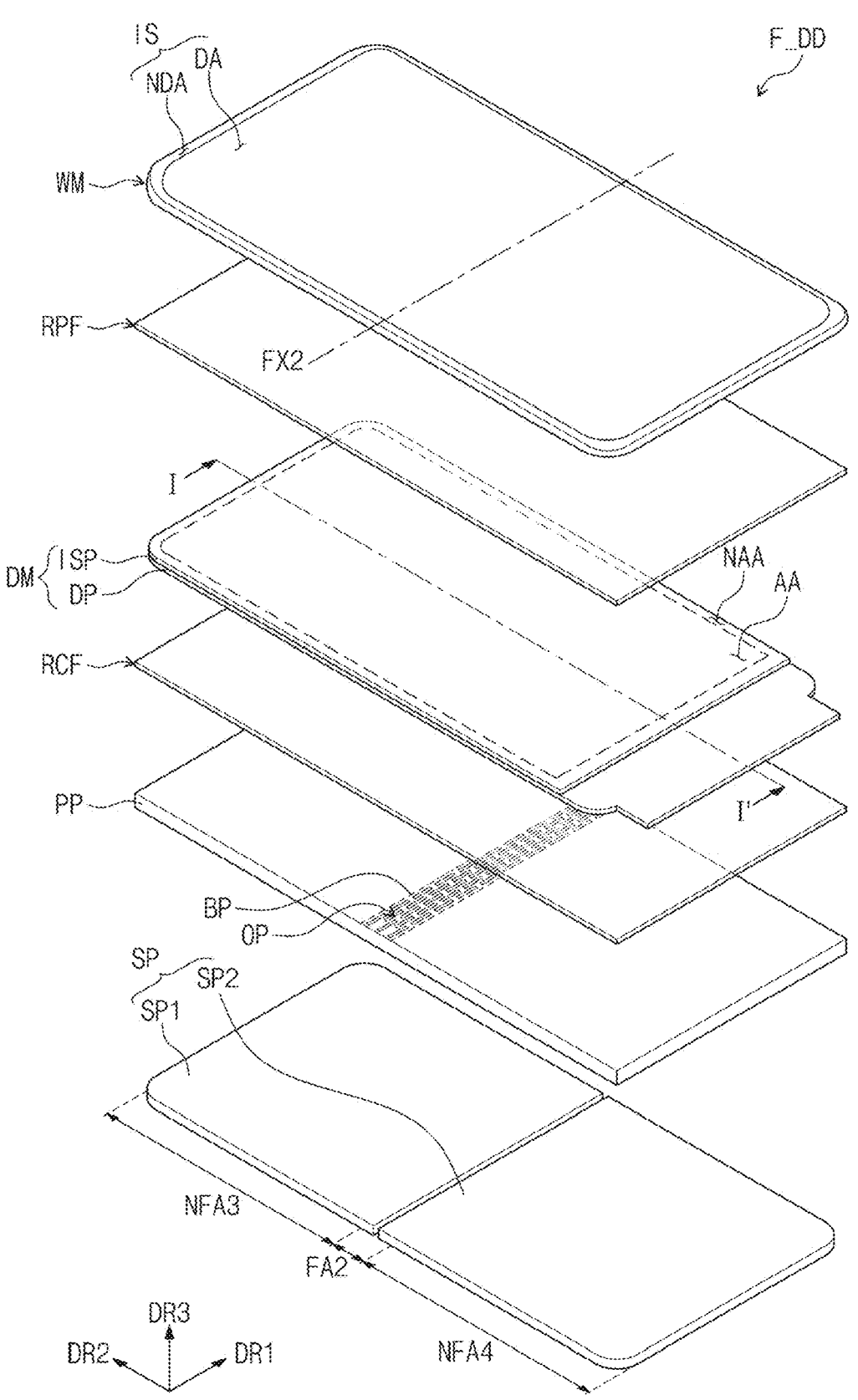
FIG. 10 is an exploded perspective view showing a display device according to an embodiment of the disclosure.
Figure 11:
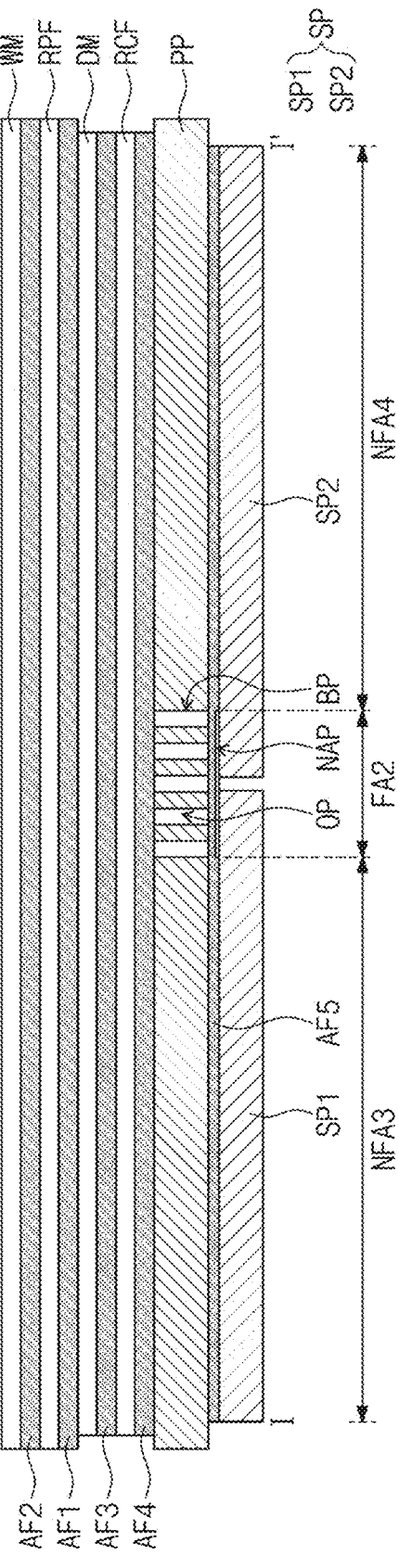
FIG. 11 is a cross-sectional view taken along line I-I' shown in FIG. 10 to show the display device.

FIG. 10 is an exploded perspective view showing the display device F_DD of FIG. 7 according to an embodiment of the disclosure, and FIG. 11 is a cross-sectional view taken along line I-I' of the display device F_DD shown in FIG. 10.

Referring to FIGS. 10 and 11, an embodiment of the display device F_DD may include a display module DM for displaying an image, an upper module disposed on the display module DM, and a lower module disposed under the display module DM. The display module DM may correspond to a portion of the display device F_DD, and the image may be generated by the display module DM.

The display module DM may include a display panel DP and an input sensing layer ISP. An embodiment of the display panel DP according to the disclosure may be a light-emitting type display panel, but not being particularly limited. In one alternative embodiment, for example, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot and a quantum rod. Hereinafter, for convenience of description, embodiments where the display panel DP is the organic light emitting display panel will be described in detail.

The display panel DP may be a flexible display panel. Accordingly, the display panel DP may be entirely rolled or may be folded or unfolded about the second folding axis FX2.

The input sensing layer ISP may be disposed directly on the display panel DP. According to an embodiment, the input sensing layer ISP may be formed on the display panel DP through successive processes. In such an embodiment, when the input sensing layer ISP is disposed directly on the display panel DP, an adhesive film may not be disposed between the input sensing layer ISP and the display panel DP. In one embodiment, for example, the input sensing layer ISP may be disposed directly on the encapsulation layer 140 (refer to FIG. 2B) of the display panel DP, but not being limited thereto or thereby. Alternatively, an adhesive film may be disposed between the input sensing layer ISP and the display panel DP. In such an embodiment, the input sensing layer ISP is not manufactured together with the display panel DP through the successive processes. In such an embodiment, the input sensing layer ISP may be fixed to an upper surface of the display panel DP by the adhesive film after being manufactured through a separate process.

The display panel DP may generate the image, and the input sensing layer ISP may obtain coordinate information about an external input or the user input, e.g., a touch event.

The upper module may include a window WM disposed on the display module DM. The window WM may include an optically transparent insulating material. Therefore, the user may easily perceive the image generated by the display module DM through the window WM.

In one embodiment, for example, the window WM may include a glass substrate or a synthetic resin film. In an embodiment where the window WM includes the thin film glass, the window WM may have a thickness equal to or smaller than about 80 micrometers, e.g., about 30 micrometers, however, the thickness of the window WM is not limited thereto or thereby.

In an embodiment where the window WM includes the synthetic resin film, the window WM may include a polyimide ("PI") film or a PET film.

The window WM may have a single-layer or multi-layer structure. In one embodiment, for example, the window WM may include a plurality of synthetic resin films coupled to each other by an adhesive or a glass substrate and a synthetic resin film coupled to the glass substrate by the adhesive. The window WM may include a flexible material. Thus, the window WM may be folded or unfolded about the second folding axis FX2. In such an embodiment, the shape of the window WM may be changed when the shape of the display module DM is changed.

The window WM transmits the image from the display module DM and substantially simultaneously buffers external impacts to prevent the display module DM from being damaged or malfunctioning due to the external impacts. The external impacts indicate external forces represented by pressure or stress, which cause defects in the display module DM.

The upper module may further include a protective layer disposed on the window WM. The protective layer may improve an impact resistance of the window WM and may prevent the window WM from shattering when damaged. The protective layer may include at least one selected from a urethane-based resin, an epoxy-based resin, a polyester-based resin, a polyether-based resin, an acrylate-based resin, an acrylonitrile-butadiene-styrene ("ABS") resin, and a rubber. In one embodiment, for example, the protective layer may include at least one selected from phenylene, PET, PI, polyamide ("PAI"), PEN, and PC.

The upper module may further include an anti-reflection film RPF disposed between the display module DM and the window WM. The anti-reflection film RPF is substantially the same as that described above with reference to FIGS. 2A to 3, and any repetitive detailed descriptions of the anti-reflection film RPF will be omitted.

The upper module may include first and second adhesive films AF1 and AF2. The first adhesive film AF1 may be disposed between the anti-reflection film RPF and the display module DM, and the second adhesive film AF2 may be disposed between the window WM and the anti-reflection film RPF. As shown in FIG. 3, in an embodiment where the anti-reflection film RPF includes the second adhesive layer AL2, the first adhesive film AF1 may be omitted. The anti-reflection film RPF may be attached to an upper surface of the display module DM by the first adhesive film AF1, and the window WM may be attached to an upper surface of the anti-reflection film RPF by the second adhesive film AF2. At least one selected from first and second adhesive films AF1 and AF2 may be omitted in the display device F_DD.

The display module DM may display the image in response to electrical signals and may transmit/receive information about the external input. The display module DM may include an active area AA and a peripheral area NAA. The active area AA may be defined as an area through which the image provided from the display module DM transmits. The peripheral area NAA may be defined adjacent to the active area AA. In one embodiment, for example, the peripheral area NAA may surround the active area AA. However, this is merely one embodiment, and alternatively, the peripheral area NAA may be defined in various shapes, but not being particularly limited. According to an embodiment, the active area AA of the display module DM may correspond to at least a portion of a display area DA.

The lower module may include a lower plate PP that is disposed on a rear surface of the display module DM and supports the display module DM. The lower plate PP may have a plate shape. In one embodiment, for example, the lower plate PP may have a single unitary plate with a size corresponding to that of the display module DM. In an embodiment, the lower plate PP may include a metal material. In such an embodiment, the lower plate PP may be a metal plate. In one embodiment, for example, the lower plate PP may include stainless steel, aluminum, or an alloy thereof. The lower plate PP may have a strength greater than a strength of the display module DM.

The lower plate PP may include a bending portion BP corresponding to a second folding area FA2. A plurality of patterns OP may be provided in the bending portion BP. The patterns OP may be spaced apart from each other by a predetermined distance while being arranged in the bending portion BP. The patterns OP may be arranged in a zigzag shape. In an embodiment, each of the patterns OP may be an opening pattern defined through the lower plate PP, but not being limited thereto or thereby. Alternatively, each of the patterns OP may be a groove pattern defined by being recessed from one surface (an upper surface or a lower surface) of the lower plate PP. Each of the patterns OP may have a quadrangular shape extending in the first direction DR1 along the second folding area FA2, but the shape of the patterns OP is not limited thereto or thereby. In one alternative embodiment, for example, each of the patterns OP may have a lozenge shape or a circular shape.

In such an embodiment, the patterns OP are provided in the bending portion BP, such that a flexibility of the bending portion BP may increase. The lower plate PP may support the display module DM and may allow the display device DD to be easily folded.

The bending portion BP of the lower plate PP may include a plurality of support bars. Each of the support bars may have a bar shape extending in the first direction DR1. The bending portion BP may include the patterns OP provided between the support bars. Each of the patterns OP may be a slit pattern. The support bars may be spaced apart from each other by a plurality of slit patterns. Each of the support bars may have a quadrangular shape in a cross-section when viewed in the second direction DR2, but the shape in the cross-section of the support bars is not limited thereto or thereby. In one alternative embodiment, for example, each of the support bars may have a trapezoidal or triangular cross section.

The lower module may further include a retardation control film RCF disposed between the lower plate PP and the display module DM. In such an embodiment, the retardation control film RCF is substantially the same as that described above with reference to FIGS. 2A to 6, and any repetitive detailed descriptions thereof will be omitted.

In an embodiment, the retardation control film RCF may have a size corresponding to the second folding area FA2 and third and fourth non-folding areas NFA3 and NFA4. In such an embodiment, the retardation control film RCF may overlap the second folding area FA2 and the third and fourth non-folding areas NFA3 and NFA4.

The retardation control film RCF may perform a function between the display module DM and the lower plate PP to protect the rear surface of the display module DM, however, this is merely one embodiment. According to an alternative embodiment, a protective film having a protective function may be additionally disposed between the lower plate PP and the display module DM. In one embodiment, for example, the protective film may be disposed between the retardation control film RCF and the display module DM or between the retardation control film RCF and the lower plate PP.

In an embodiment, the lower module may further include third and fourth adhesive films AF3 and AF4. The third adhesive film AF3 may be disposed between the retardation control film RCF and the display module DM, and the fourth adhesive film AF4 may be disposed between the retardation control film RCF and the lower plate PP. Accordingly, the retardation control film RCF may be attached to the rear surface of the display module DM by the third adhesive film AF3 and may be coupled with the lower plate PP by the fourth adhesive film AF4.

The lower module may further include a support plate SP. The number of support plates SP1 and SP2 may correspond to the number of non-folding areas NFA3 and NFA4. In one embodiment, for example, the support plate SP may include a first support plate SP1 and a second support plate SP2 disposed to be spaced apart from the first support plate SP1.

The first and second support plates SP1 and SP2 may be disposed to respectively correspond to the third and fourth non-folding areas NFA3 and NFA4. The first support plate SP1 may be disposed to correspond to the third non-folding area NFA3 of the display module DM, and the second support plate SP2 may be disposed to correspond to the fourth non-folding area NFA4 of the display module DM. The first support plate SP1 may be disposed to correspond to a first portion of the lower plate PP, and the second support plate SP2 may be disposed to correspond to a second portion of the lower plate PP.

Each of the first and second support plates SP1 and SP2 may include a metal material. In an embodiment, each of the first and second support plates SP1 and SP2 may be a metal plate. In one embodiment, for example, each of the first and second support plates SP1 and SP2 may include a same material as that of the lower plate PP, but not being limited thereto or thereby. In one alternative embodiment, for example, only one of the lower plate PP and the support plate SP may include the metal material, and the other of the lower plate PP and the support plate SP may include a plastic material.

In a case where the display module DM is in a first state that is a flat state, the first and second support plates SP1 and SP2 may be spaced apart from each other in the second direction DR2. In a case where the display module DM is in a second state that is a folded with respect to the second folding axis FX2, the first and second support plates SP1 and SP2 may be spaced apart from each other in the third direction DR3.

The first and second support plates SP1 and SP2 may be spaced apart from each other with respect to the second folding area FA2. The first and second support plates SP1 and SP2 may overlap a portion of the second folding area FA2. That is, a distance between the first and second support plates SP1 and SP2 in the second direction DR2 may be smaller than a width of the second folding area FA2.

The support plate SP may further include a connection module to connect the first and second support plates SP1 and SP2. The connection module may include a hinge module or a multi joint module.

In an embodiment, the support plate SP includes two support plates SP1 and SP2, but the number of the support plates is not limited to two. In an embodiment, where the second folding axis FX2 is provided in plural, the support plate SP may include a plurality of support plates separated from each other with respect to the second folding axes FX2.

A fifth adhesive film AF5 may include an upper surface facing the lower plate PP and a lower surface facing the support plate SP. The fifth adhesive film AF5 may be a double-sided adhesive film. Accordingly, the first support plate SP1 may be coupled with the lower plate PP by the fifth adhesive film AF5, and the second support plate SP2 may be coupled with the lower plate PP by the fifth adhesive film AF5.

In one embodiment, for example, the fifth adhesive film AF5 may include a non-adhesive portion NAP formed by recessing a portion of the lower surface toward the upper surface in the second folding area FA2. In such an embodiment, the fifth adhesive film AF5 may not be adhered to the first and second support plates SP1 and SP2 in the second folding area FA2 by the non-adhesive portion NAP. In one embodiment, for example of the disclosure, the non-adhesive portion NAP is defined as an area from which the adhesive film is partially removed, but not being limited thereto or thereby. In an embodiment, the fifth adhesive film AF5 may be processed to lose its adhesion in a portion corresponding to the second folding area FA2. In an embodiment, the fifth adhesive film AF5 may be completely removed from the second folding area FA2.

Each of the first to fifth adhesive films AF1 to AF5 may include an optically transparent adhesive material. In one embodiment, for example, each of the first to fifth adhesive films AF1 to AF5 may include a PSA, an optical clear adhesive ("OCA") or an optical clear resin ("OCR").

FIGS. 10 and 11 show embodiments having a structure in which the lower module includes the lower plate PP and the support plate SP, but the structure of the lower module is not limited thereto or thereby. According to an alternative embodiment, the lower module may include only one of the lower plate PP and the support plate SP. In one embodiment, for example, where the lower module includes only the lower plate PP among the lower plate PP and the support plate SP, the retardation control film RCF may be disposed between the lower plate PP and the display module DM, and in this case, the lower plate PP may be referred to as the support plate.

In an embodiment, the lower module may further include a cushion panel. The cushion panel may be disposed between the display module DM and the lower plate PP. The cushion panel may include a sponge, a foam, or a urethane resin. The cushion panel may prevent the lower plate PP from being pressed and plastic-deformed by external impact and force. In such an embodiment, the cushion panel may improve the impact resistance of the display device F_DD. In one embodiment, for example, the cushion panel may include an elastomer. In one embodiment, for example, the cushion panel may include polyurethane. In an embodiment where the cushion panel includes polyurethane, the cushion panel may have a thickness in a range of about 100 micrometers (µm) to about 150 µm.

In an embodiment, where the lower module further includes the cushion panel, even though the lower plate PP is deformed due to the folding operation, the deformation may not be transmitted to the display module DM. Accordingly, a phenomenon in which the deformation of patterns OP defined in the lower plate PP is viewed through the display module DM may be effectively prevented and improved. The cushion panel may be coupled to the lower plate PP by an adhesive film.

As described above, in an embodiment where at least one of the lower plate PP and the support plate SP employed in the display device F_DD includes the metal material, the display device F_DD may include the retardation control film RCF disposed between the display module DM and the support plate SP. The retardation control film RCF may have the thickness retardation Rth in a range of about 0 nm to about 100 nm.

As described above with reference to FIGS. 5A and 5B, the external light L1 reflected by the lower plate PP or the support plate SP may not pass through the polarization layer PL, and thus, may not be visually recognized by the user. That is, the anti-reflection function of the display device F_DD with respect to the external light may be improved by the retardation control film RCF disposed between the display module DM and the support plate SP.

Figure 12:
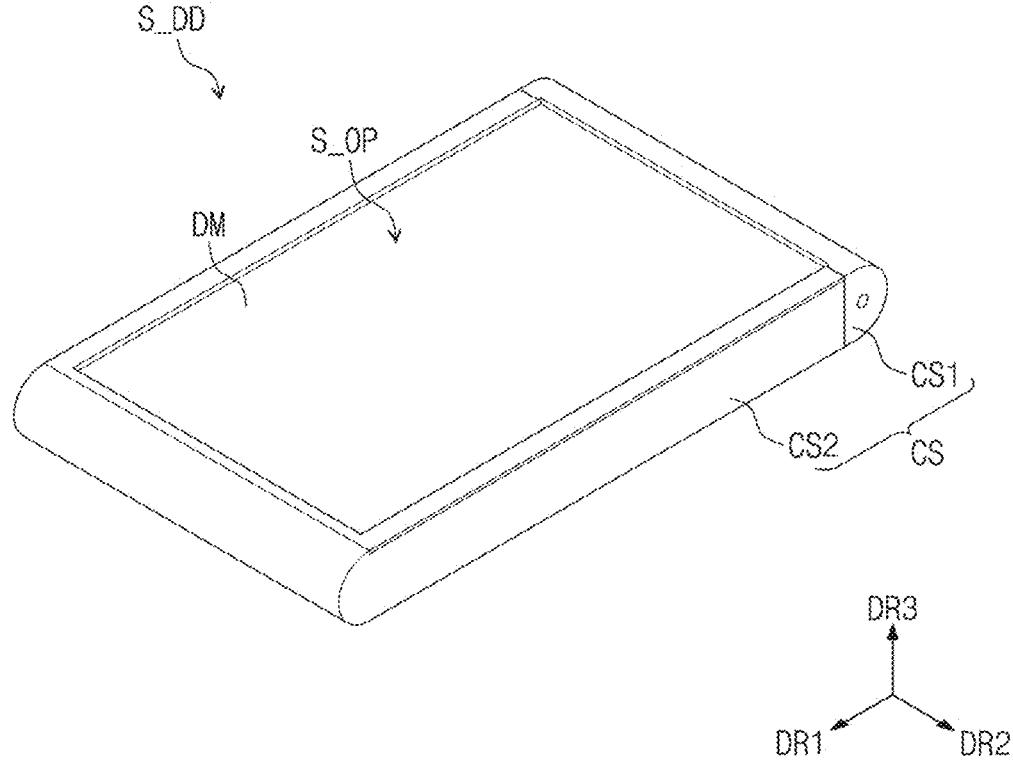
FIG. 12 is a perspective view showing a display device according to an embodiment of the disclosure.
Figure 13:
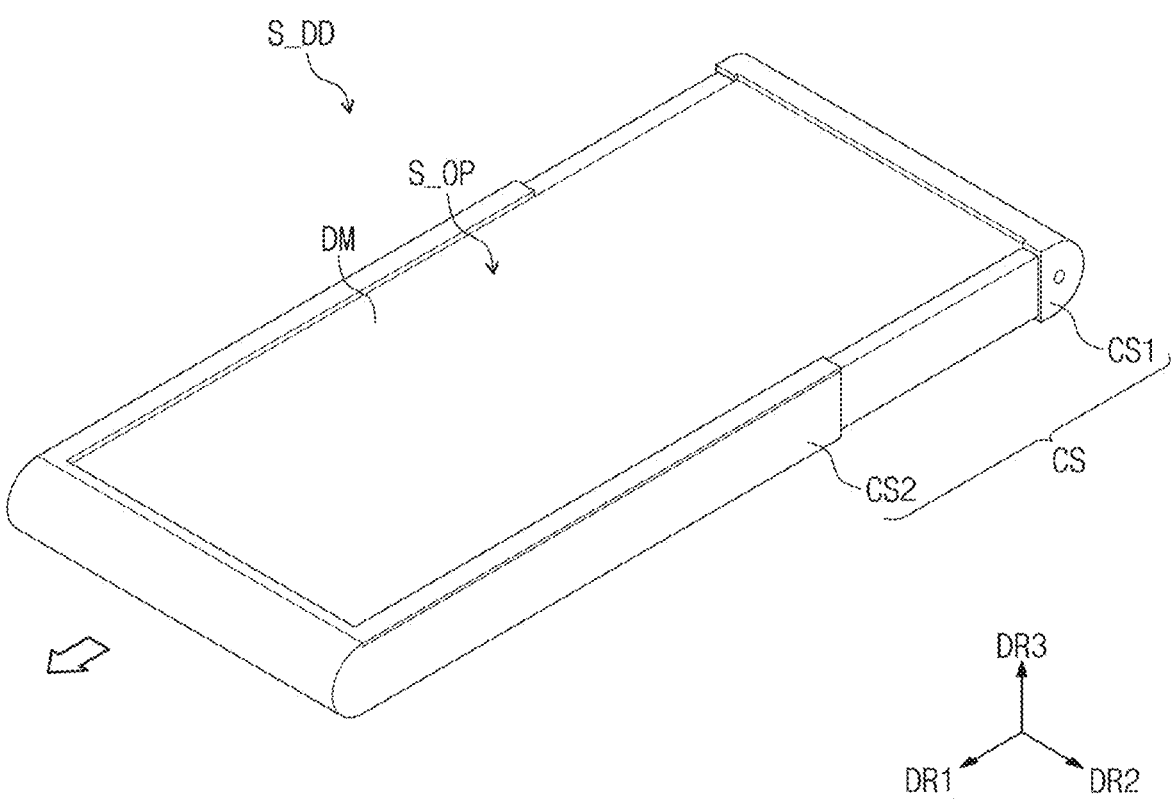
FIG. 13 is a view showing an expansion mode of the display device shown in FIG. 12.
Figure 14:
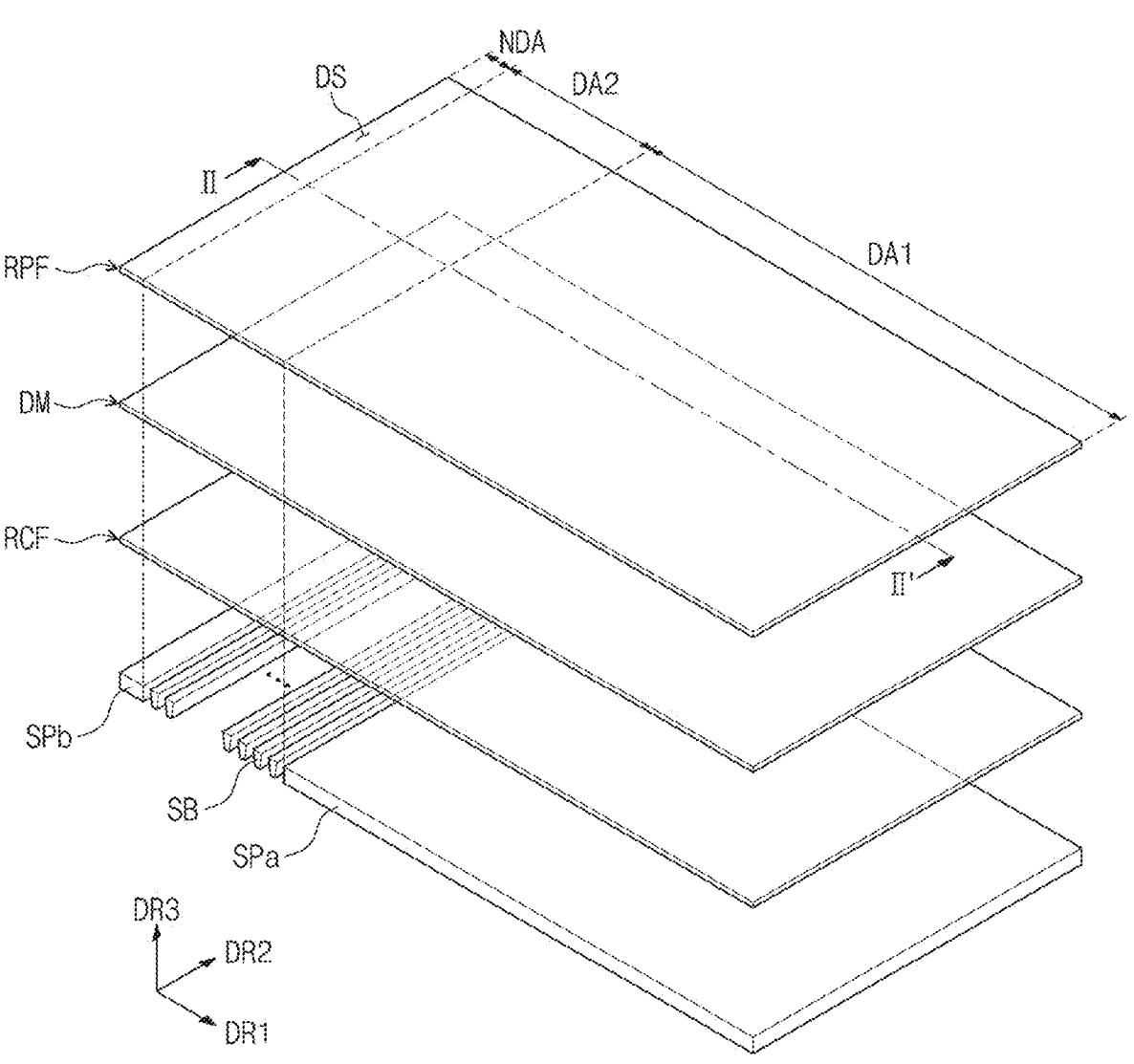
FIG. 14 is an exploded perspective view showing the display device shown in FIG. 12.
Figure 15:
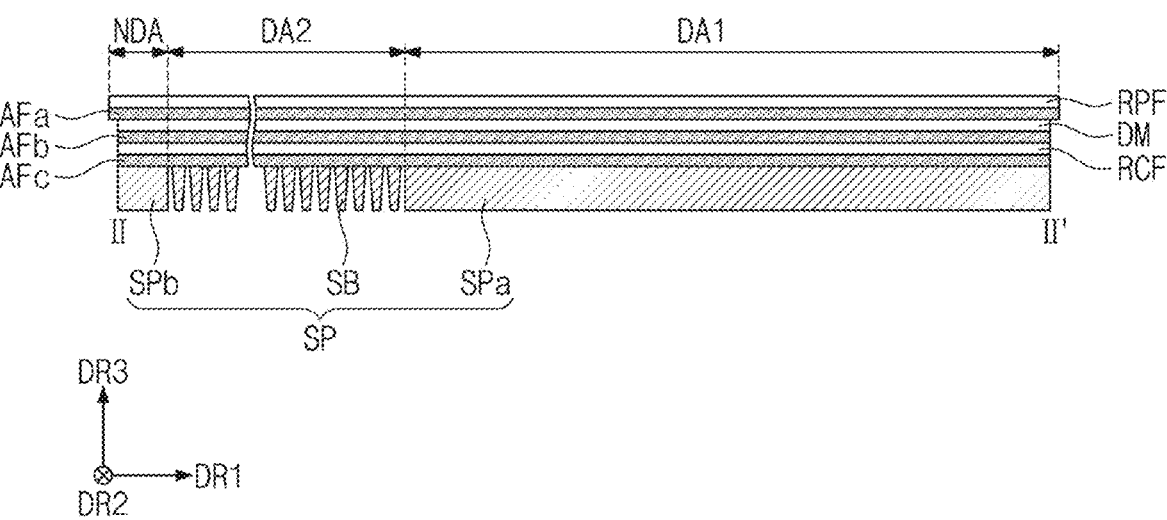
FIG. 15 is a cross-sectional view taken along line II-II' shown in FIG. 14.

FIG. 12 is a perspective view showing a display device S_DD according to an embodiment of the disclosure, and FIG. 13 is a view showing an expansion mode of the display device S_DD shown in FIG. 12. FIG. 14 is an exploded perspective view showing the display device S_DD shown in FIG. 12, and FIG. 15 is a cross-sectional view taken along line II-II' shown in FIG. 14.

Referring to FIGS. 12 to 15, the display device S_DD may include a display module DM and a case CS for accommodating the display module DM. The display module DM may be exposed to the outside via a display opening S_OP defined through an upper portion of the case CS.

The case CS may include a first case CS1 and a second case CS2. The first case CS1 and the second case CS2 may be coupled to each other to accommodate the display module DM. The first case CS1 may be coupled to the second case CS2 to be able to move in a first direction DR1.

Hereinafter, a direction crossing the first direction DR1 is referred to as a second direction DR2. A direction substantially perpendicular to a plane defined by the first direction DR1 and the second direction DR2 is referred to as a third direction DR3.

An area of an exposed surface of the display module DM, i.e., a display surface exposed through the display opening S_OP of the case CS, may be adjusted by the movement of the second case CS2. In one embodiment, for example, the display module DM may be a flexible display module and may be supported by a support plate SP disposed under the display module DM. The support plate SP may be connected to the first and second cases CS1 and CS2, and when the second case CS2 moves in the first direction DR1, the support plate SP may move in the first direction DR1.

Although not shown in figures, a portion of the display module DM except for the portion of the display module DM, which is exposed through the display opening S_OP, i.e., the display surface DS, may be disposed in the first case CS1. As the second case CS2 moves, a size of the display opening S_OP in the first direction DR1 increases. In such an embodiment, the display module DM disposed on the support plate SP may move in the first direction DR1 together with the support plate SP by the movement of the second case CS2, and thus, the exposed surface, i.e., the display surface DS, of the display module DM exposed through the display opening S_OP may be expanded. Accordingly, a user may view an image through a larger screen.

As shown in FIG. 12, a state of the display device S_DD in which the display surface DS of the display module DM is set to a basic size may be referred to as a basic mode. As shown in FIG. 13, a state of the display device S_DD in which the display surface DS of the display module DM is expanded may be referred to as an expansion mode.

Referring to FIGS. 12 to 15, the display surface DS of the display module DM may include a first display area DA1, a second display area DA2, and a non-display area NDA. The first display area DA1 of the display surface DS may have a size corresponding to the display opening S_OP of FIG. 12 in the basic mode and may determine a screen size in the basic mode. In such an embodiment, the display opening S_OP in the basic mode may expose the first display area DA1 of the display surface DS, and the second display area DA2 and the non-display area NDA may not be exposed through the display opening S_OP in the basic mode. According to an embodiment, the display opening S_OP may expose the first display area DA1 and a portion of the second display area DA2 in the basic mode.

The second display area DA2 may be defined adjacent to the first display area DA1, and in a case where the display device S_DD operates in the expansion mode, not only the first display area DA1, but also a portion of the second display area DA2 may be exposed through the display opening S_OP. In such an embodiment, the screen size of the display device S_DD may increase by the area of the exposed portion of the second display area DA2.

The non-display area NDA may be adjacent to the second display area DA2. In an embodiment, the second display area DA2 may be defined between the first display area DA1 and the non-display area NDA. The non-display area NDA may be a non-effective area that is not used as the screen of the display device S_DD.

The support plate SP may be disposed under the display module DM. The support plate SP disposed under the display module DM may support the display module DM. The support plate SP may be disposed on a rear surface opposite to the display surface DS of the display module DM. The support plate SP may include a first support plate SPa, a second support plate SPb, and a plurality of support bars SB.

The first support plate SPa may have a plate shape substantially parallel to a plane defined by the first and second directions DR1 and DR2. The first support plate SPa may have a size corresponding to the first display area DA1 of the display module DM. The first support plate SPa may be disposed on the rear surface opposite to the display surface DS of the display module DM and may support the first display area DA1 of the display module DM. The second support plate SPb may extend in the second direction DR2. The second support plate SPb may have a rectangular shape defined by long sides extending in the second direction DR2 and short sides extending in the first direction DR1. The second support plate SPb may have a size corresponding to the non-display area NDA of the display module DM. The support bars SB and the second support plate SPb may be disposed on the rear surface of the display module DM and may respectively support the second display area DA2 and the non-display area NDA.

In the basic mode, the display module DM of the second display area DA2 may be bent, and thus, may be disposed on the rear surface of the first support plate SPa. In such an embodiment, the first display area DA1 may be defined as a non-bending area, and all or a portion of the second display area DA2 may be defined as a bending area. The first support plate SPa may be disposed to correspond to the non-bending area, and the support bars SB may be disposed to correspond to the bending area.

The support bars SB may be disposed between the first support plate SPa and the second support plate SPb. The support bars SB may extend in the second direction DR2 and may be arranged in the first direction DR1. The support bars SB may be spaced apart from each other in the first direction DR1. When view in the second direction DR2, each of the support bars SB may have an inverted trapezoidal shape with respect to the display surface DS of the display module DM.

In an embodiment, as shown in FIG. 14, the support bars SB may be spaced apart from each other in the first direction DR1, but the structure of the support bars SB is not limited thereto or thereby. In one alternative embodiment, for example, the support bars SB may be implemented as a joint structure in which the support bars SB are coupled with each other to rotate relatively.

The support plate SP may include a metal material. In an embodiment, each of the first and second support plates SPa and SPb and the support bars SB may include a same metal material as each other.

The display device S_DD may further include an anti-reflection film RPF disposed on the display module DM and a retardation control film RCF disposed between the display module DM and the support plate SP. The display device S_DD may further include first, second, and third adhesive films AFa, AFb, and AFc. The display module DM, the anti-reflection film RPF, the retardation control film RCF, and the support plate SP may be coupled with each other by the first, second, and third adhesive films AFa, AFb, and AFc.

The anti-reflection film RPF and the retardation control film RCF are substantially the same as those described above with reference to FIGS. 2A to 6D, and thus, any repetitive detailed description thereof will be omitted.

The retardation control film RCF may perform a function to protect the rear surface of the display module DM between the display module DM and the support plate SP, however, this is merely one embodiment. A protective film having the protective function may be additionally disposed between the support plate SP and the display module DM. In one embodiment, for example, the protective film may be disposed between the retardation control film RCF and the display module DM or between the retardation control film RCF and the support plate SP.

As described above, in an embodiment where the support plate SP employed in the display device S_DD includes a metal material, the display device S_DD may include the retardation control film RCF disposed between the display module DM and the support plate SP. The retardation control film RCF may have a thickness retardation Rth in a range of about 0 nm to about 100 nm. The retardation control film RCF may have a size corresponding to the first and second display areas DA1 and DA2. In such an embodiment, the retardation control film RCF may overlap the first and second display areas DA1 and DA2.

In an embodiment, as described above with reference to FIGS. 5A and 5B, the external light L1 reflected by the support plate SP may not pass through the polarization layer PL, and thus, may not be visually recognized by the user. In such an embodiment, the anti-reflection function of the display device S_DD with respect to the external light may be improved by the retardation control film RCF disposed between the display module DM and the support plate SP.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a display panel comprising a substrate and a light emitting element disposed on the substrate, wherein the light emitting element generates a light;
an anti-reflection film comprising a phase retardation layer disposed on the light emitting element and a polarization layer disposed on the phase retardation layer;
a support plate disposed under the substrate of the display panel to support the display panel, wherein the support plate comprises a metal material;
a retardation control film disposed under the substrate of the display panel between the substrate of the display panel and the support plate to prevent light reflected by the support plate from passing through the polarization layer; and
a lower plate disposed between the support plate and the display panel,
wherein the substrate and the light emitting element of the display panel are disposed between the phase retardation layer and the retardation control film, and
the retardation control film is disposed between the display panel and the lower plate.

2. The display device of claim 1, wherein the retardation control film comprises a plurality of phase retardation layers sequentially stacked one on another.

3. The display device of claim 1, wherein the retardation control film comprises at least one selected from a polyester-based resin, a polyolefin-based resin, an acrylic-based resin, a polyurethane-based resin, a polyethersulfone-based resin, a polycarbonate-based resin, a polysulfone-based resin, and a polyether-based resin.

4. The display device of claim 3, wherein the retardation control film has a light transmittance equal to or greater than about 85%.

5. The display device of claim 1, wherein the display panel comprises a first non-folding area, a second non-folding area, and a folding area defined between the first non-folding area and the second non-folding area.

6. The display device of claim 5, wherein the retardation control film overlaps the first non-folding area, the second non-folding area, and the folding area.

7. The display device of claim 5, wherein the support plate comprises:
a first support plate disposed under the display panel to correspond to the first non-folding area; and
a second support plate disposed under the display panel to correspond to the second non-folding area and spaced apart from the first support plate.

8. The display device of claim 7, wherein
the lower plate comprises a bending portion overlapping the folding area.

9. The display device of claim 1, wherein the retardation control film has a thickness retardation in a range of about 0 nm to about 100 nm.

10. The display device of claim 1, wherein the lower plate comprises a metal material.

11. The display device of claim 1, wherein the phase retardation layer comprises:
a $\lambda/2$ phase retardation layer disposed between the polarization layer and the display panel; and
a $\lambda/4$ phase retardation layer disposed between the $\lambda/2$ phase retardation layer and the display panel.

12. The display device of claim 1, wherein the retardation control film has a reverse wavelength dispersibility.

13. An electronic device comprising a folding area, which is foldable about an imaginary folding axis, the electronic device comprising:
a display panel comprising a substrate and a light emitting element disposed on the substrate, wherein the light emitting elements generates a light;
an anti-reflection film comprising a phase retardation layer disposed on the light emitting element and a polarization layer disposed on the phase retardation layer;
a support plate disposed under the substrate of the display panel to support the display panel, wherein the support plate comprises a metal material;
a retardation control film having a thickness retardation in a range of about 0 nm to about 100 nm and disposed under the substrate of the display panel between the substrate of the display panel and the support plate to prevent light reflected by the support plate from passing through the polarization layer; and
a lower plate disposed between the support plate and the display panel,
wherein the substrate and the light emitting element of the display panel are disposed between the phase retardation layer and the retardation control film, and
the retardation control film is disposed between the display panel and the lower plate.

14. The electronic device of claim 13, further comprising:
first and second non-folding areas adjacent to the folding area,
wherein the support plate comprises:
a first support plate disposed under the display panel to correspond to the first non-folding area; and
a second support plate disposed under the display panel to correspond to the second non-folding area and spaced apart from the first support plate.

15. The electronic device of claim 14, wherein
the lower plate comprises a bending portion overlapping the folding area.

16. The electronic device of claim 13, wherein the retardation control film has a thickness retardation in a range of about 0 nm to about 100 nm.

17. The electronic device of claim 13, wherein the lower plate comprises a metal material.

18. The electronic device of claim 13, wherein the phase retardation layer comprises:
a $\lambda/2$ phase retardation layer disposed between the polarization layer and the display panel; and
a $\lambda/4$ phase retardation layer disposed between the $\lambda/2$ phase retardation layer and the display panel.

19. The electronic device of claim 13, wherein the retardation control film has a reverse wavelength dispersibility.

* * * * *